US012787294B2

(12) United States Patent
Kim et al.

(10) Patent No.: US 12,787,294 B2
(45) Date of Patent: Nov. 3, 2026

(54) SEMICONDUCTOR MEMORY DEVICE

(71) Applicant: SK hynix Inc., Icheon-si (KR)

(72) Inventors: Jae Taek Kim, Icheon-si (KR); Hye Yeong Jung, Icheon-si (KR)

(73) Assignee: SK hynix Inc., Icheon-si (KR)

(*) Notice: Subject to any disclaimer, the term of this patent is extended or adjusted under 35 U.S.C. 154(b) by 246 days.

(21) Appl. No.: 18/661,266

(22) Filed: May 10, 2024

(65) Prior Publication Data

US 2025/0194093 A1 Jun. 12, 2025

(30) Foreign Application Priority Data

Dec. 12, 2023 (KR) ........................ 10-2023-0179864

(51) Int. Cl.

*H10B 43/50* (2023.01)
*H10B 41/27* (2023.01)
*H10B 41/30* (2023.01)
*H10B 41/50* (2023.01)
*H10B 43/27* (2023.01)
*H10B 43/30* (2023.01)

(52) U.S. Cl.

CPC ............. *H10B 43/50* (2023.02); *H10B 41/27* (2023.02); *H10B 41/30* (2023.02); *H10B 41/50* (2023.02); *H10B 43/27* (2023.02); *H10B 43/30* (2023.02)

(58) Field of Classification Search

CPC ........ H10B 43/50; H10B 41/27; H10B 41/30; H10B 41/50; H10B 43/27; H10B 43/30; H10B 43/40; H10B 43/10; H10B 43/35

See application file for complete search history.

(56) References Cited

U.S. PATENT DOCUMENTS

| | | | | |
|---|---|---|---|---|
| 10,763,222 B2* | 9/2020 | Jeong | H10B 41/27 |
| 11,121,149 B2* | 9/2021 | Tanaka | H10B 41/10 |
| 11,990,372 B2* | 5/2024 | Park | H10B 43/40 |
| 2020/0051995 A1* | 2/2020 | Tanaka | H10B 41/10 |
| 2021/0313343 A1* | 10/2021 | Jung | H10B 41/10 |
| 2022/0045045 A1* | 2/2022 | Lee | H10B 41/10 |
| 2022/0165740 A1* | 5/2022 | Kim | H10B 41/10 |
| 2022/0165748 A1* | 5/2022 | Kim | H10B 43/10 |
| 2022/0310808 A1* | 9/2022 | Kajino | G11C 16/0483 |
| 2023/0217651 A1* | 7/2023 | Eom | H10B 41/27 257/314 |
| 2026/0020239 A1* | 1/2026 | Choi | H10B 41/27 |

FOREIGN PATENT DOCUMENTS

| | | | | |
|---|---|---|---|---|
| KR | 20220068059 A * | 5/2022 | H10P 54/00 |
| KR | 1020220138342 A | 10/2022 | |

* cited by examiner

*Primary Examiner* — Mohammed Shamsuzzaman

(74) *Attorney, Agent, or Firm* — WILLIAM PARK AND ASSOCIATES LTD.

(57) ABSTRACT

A semiconductor memory device includes a dummy stack structure, an insulative chip guard pattern penetrating a lower portion of the dummy stack structure, and a conductive chip guard pattern which is aligned over the insulative chip guard pattern and penetrates an upper portion of the dummy stack structure.

11 Claims, 24 Drawing Sheets

SEMICONDUCTOR MEMORY DEVICE

CROSS-REFERENCE TO RELATED APPLICATION

The present application claims priority under 35 U.S.C. § 119(a) to Korean patent application number 10-2023-0179864 filed on Dec. 12, 2023, in the Korean Intellectual Property Office, the entire contents of which application is incorporated herein by reference.

BACKGROUND

1. Technical Field

The present disclosure generally relates to a semiconductor memory device, and more particularly, to a three-dimensional semiconductor memory device.

2. Related Art

Semiconductor memory devices are applied to electronic systems in various fields, including automobiles, medical appliances, data centers, and the like, in addition to compact electronic devices. Accordingly, demands for semiconductor memory devices have increased.

A semiconductor memory device may include a memory cell for data storage. A three-dimensional semiconductor memory device includes three-dimensionally arranged memory cells, to be advantageous for mass storage as compared with two-dimensional semiconductor memory devices.

The degree of integration of the three-dimensional semiconductor device may be improved by increasing the stacked number of memory cells (i.e., the number of memory cells in each memory cell string). As the stacked number of memory cells is increased, the stability of a manufacturing process may deteriorate.

SUMMARY

In accordance with an embodiment of the present disclosure, a semiconductor memory device includes: a lower structure including a circuit region and a chip guard region, the chip guard region surrounding the circuit region; a memory cell array structure overlapping with a first region of the circuit region of the lower structure; a conductive vertical contact structure overlapping with a second region of the circuit region of the lower structure; a dummy stack structure stacked over the chip guard region of the lower structure; an insulative chip guard pattern penetrating a lower portion of the dummy stack structure; and a conductive chip guard pattern aligned over the insulative chip guard pattern, the conductive chip guard pattern penetrating an upper portion of the dummy stack structure.

In accordance with an embodiment of the present disclosure, a semiconductor memory device includes: a lower structure including a circuit region and a chip guard region, the chip guard region surrounding the circuit region; a memory cell array structure overlapping with a first region of the circuit region of the lower structure; a conductive vertical contact structure overlapping with a second region of the circuit region of the lower structure; a dummy stack structure stacked over the chip guard region of the lower structure; an insulative chip guard pattern penetrating a portion of the dummy stack structure; and a conductive chip guard pattern penetrating a different portion of the dummy stack structure to contact the insulative chip guard pattern.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

The specific structural and functional descriptions disclosed herein are merely illustrative for the purpose of describing embodiments according to the concept of the present disclosure. The embodiments according to the concept of the present disclosure can be modified in various forms and replaced with other equivalent embodiments. Thus, the present disclosure should not be construed as limited to the embodiments set forth herein.

It will be understood that, although the terms "first," "second," etc. may be used herein to describe various elements, these elements should not be limited by these terms. These terms are only used to distinguish one element from another element, and the order or number of components is not limited by the terms.

Embodiments provide a semiconductor memory device capable of improving the stability of a manufacturing process.

Figure 1:
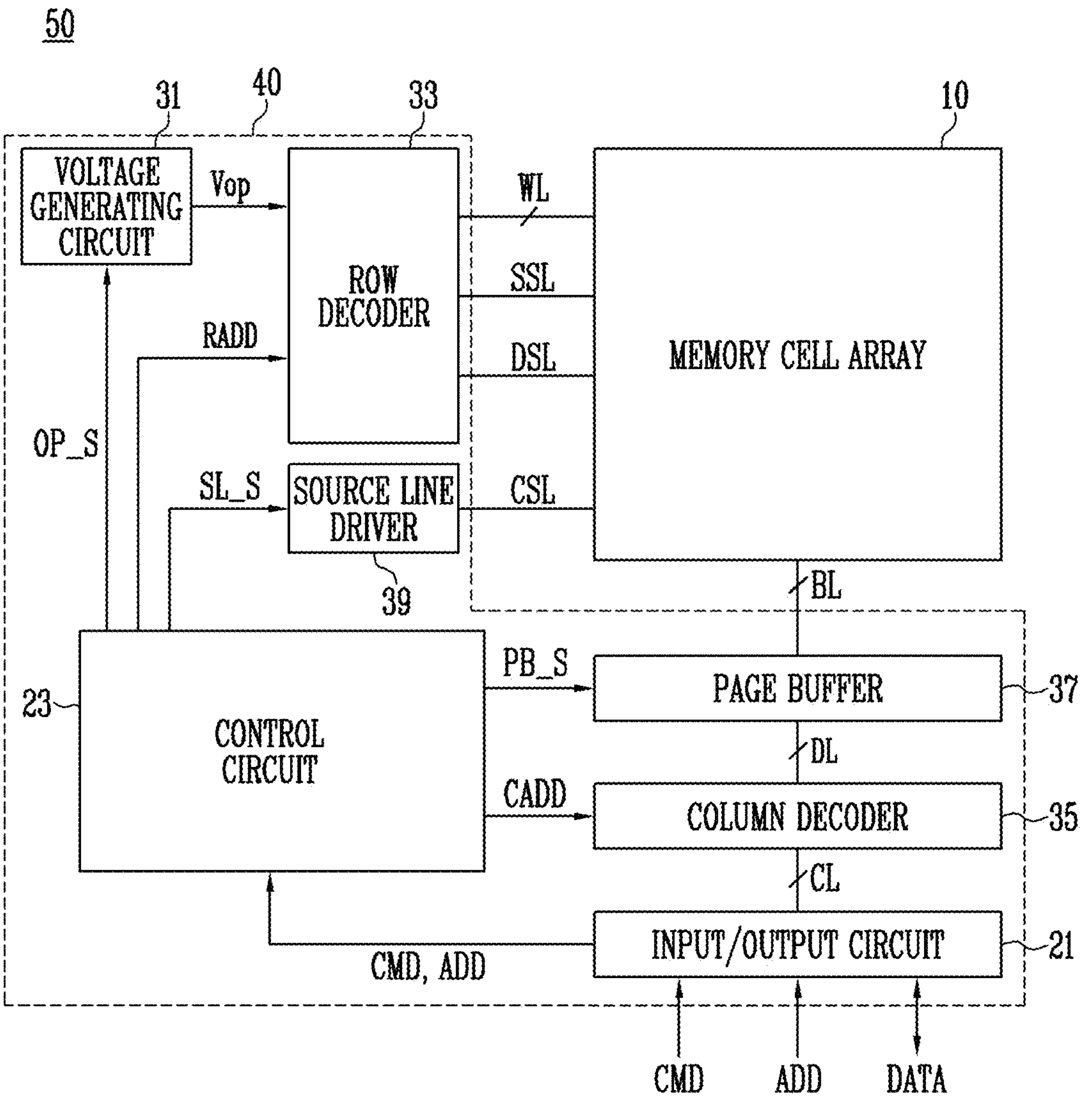
FIG. 1 is a block diagram illustrating a semiconductor memory device in accordance with an embodiment of the present disclosure.

FIG. 1 is a block diagram illustrating a semiconductor memory device in accordance with an embodiment of the present disclosure.

Referring to FIG. 1, the semiconductor memory device 50 may include a peripheral circuit 40 and a memory cell array 10.

The peripheral circuit 40 may be configured to perform a program operation for storing data in the memory cell array 10, a read operation for outputting data stored in the memory cell array 10, and an erase operation for erasing data stored in the memory cell array 10. In an embodiment, the peripheral circuit 40 may include an input/output circuit 21, a control circuit 23, a voltage generating circuit 31, a row decoder 33, a column decoder 35, a page buffer 37, and a source line driver 39.

The memory cell array 10 may include a plurality of memory cells in which data is stored. The memory cells may be three-dimensionally arranged. The memory cell array 10 may be connected to a drain select group DSL, a word line group WL, a source select group SSL, a plurality of bit lines BL, and a common source line CSL.

The input/output circuit 21 may transfer a command CMD and an address ADD to the control circuit 23. The command CMD and the address ADD may be transferred from an external device (e.g., a memory controller) of the semiconductor memory device 50. The input/output circuit 21 may exchange data DATA with the external device and the column decoder 35.

The control circuit 23 may output an operation signal OP_S, a row address RADD, a source line control signal SL_S, a page buffer control signal PB_S, and a column address CADD in response to the command CMD and the address ADD.

The voltage generating circuit 31 may generate various operating voltages Vop used for a program operation, a read operation, and an erase operation in response to the operation signal OP_S.

The row decoder 33 may transfer the operating voltages Vop to the drain select group DSL, the word line group WL, and the source select group SSL in response to the row address RADD.

The column decoder 35 may transmit data DATA input from the input/output circuit 21 to the page buffer 37 in response to the column address CADD. The column decoder 35 may transmit data DATA stored in the page buffer 37 to the input/output circuit 21 in response to the column address CADD. The column decoder 35 may exchange data DATA with the input/output circuit 21 through column lines CL. The column decoder 35 may exchange data DATA with the page buffer 37 through data lines DL.

The page buffer 37 may store data DATA received through the bit lines BL in response to the page buffer control signal PB_S. The page buffer 37 may sense a voltage or current of the bit lines BL in a read operation.

The source line driver 39 may control a voltage applied to the common source line CSL in response to the source line control signal SL_S.

Figure 2:
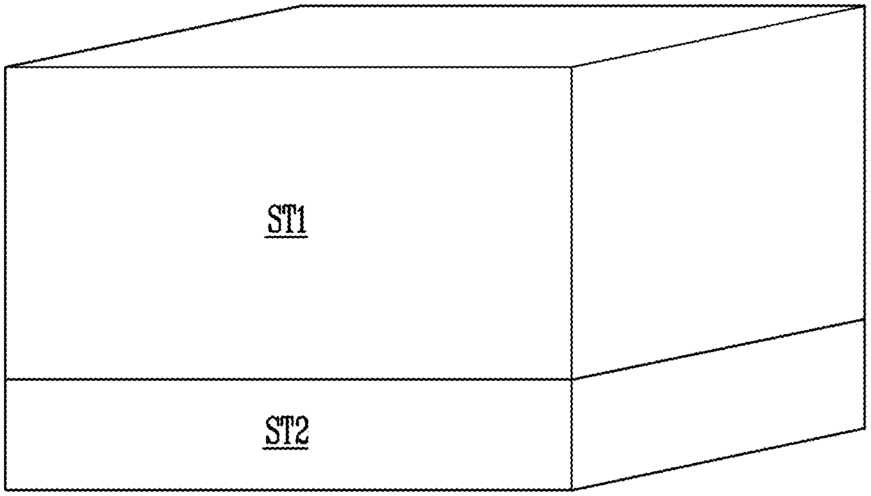
FIG. 2 is a perspective view illustrating a semiconductor memory device in accordance with an embodiment of the present disclosure.

FIG. 2 is a perspective view illustrating a semiconductor memory device in accordance with an embodiment of the present disclosure.

Referring to FIG. 2, the semiconductor memory device may include a first structure ST1 and a second structure ST2. The first structure ST1 may overlap with the second structure ST2.

Each of the first structure ST1 and the second structure ST2 may include a circuit structure, the circuit structure including a circuit of the semiconductor memory device and a chip guard structure surrounding the circuit structure.

A circuit structure of the first structure ST1 may include a memory cell array structure, the memory cell array structure including the memory cell array 10 shown in FIG. 1, a doped semiconductor structure connected to the memory cell array structure, a plurality of bit lines connected to the memory cell array structure, an interconnection connected to the memory cell array structure, and a peripheral contact structure spaced part from the memory cell array structure. A circuit structure of the second structure ST2 may include a peripheral circuit structure, the peripheral circuit structure including the peripheral circuit 40 shown in FIG. 1, and an interconnection connected to the peripheral circuit structure. The peripheral contact structure of the first structure ST1 may be connected to a portion of the interconnection of the second structure ST2. The interconnection of each of the first structure ST1 and the second structure ST2 may include various conductive structures, such as a conductive contact plug, a conductive line, conductive bonding pads, and the like.

The chip guard structure of each of the first structure ST1 and the second structure ST2 may reduce the chances of a pollutant infiltrating the circuit structure and/or the amount of pollutant infiltrating the circuit structure. A chip guard structure of the first structure ST1 may overlap with a chip guard structure of the second structure ST2.

Figure 3:
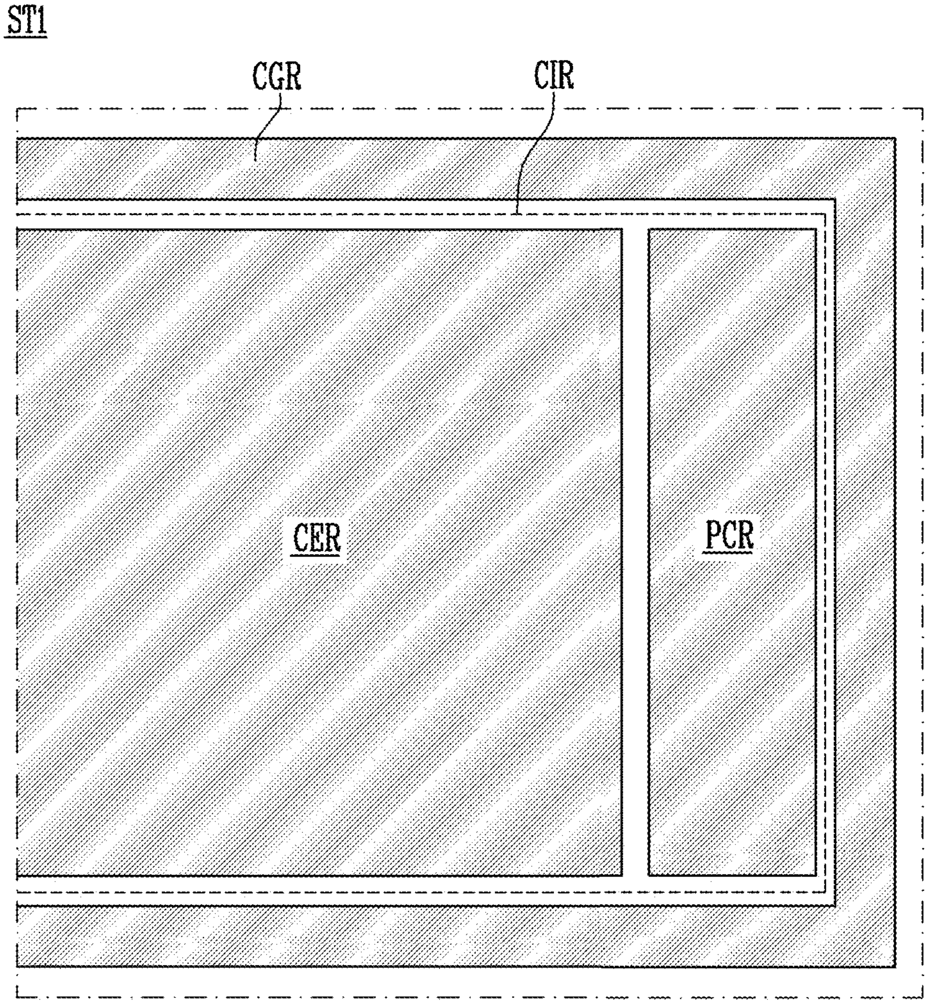
FIG. 3 is a plan view illustrating a circuit region and a chip guard region of a first structure in accordance with an embodiment of the present disclosure.

FIG. 3 is a plan view illustrating a circuit region and a chip guard region of the first structure in accordance with an embodiment of the present disclosure.

Referring to FIG. 3, a circuit region CIR of the first structure ST1 may include a first region CER and a second region PCR. The first region CER may be a region in which the memory cell array structure is disposed. The second region PCR may be a region in which the peripheral contact structure is disposed.

A chip guard region CGR may surround the circuit region CIR. The chip guard structure may be formed along the chip guard region CGR.

Figure 4:
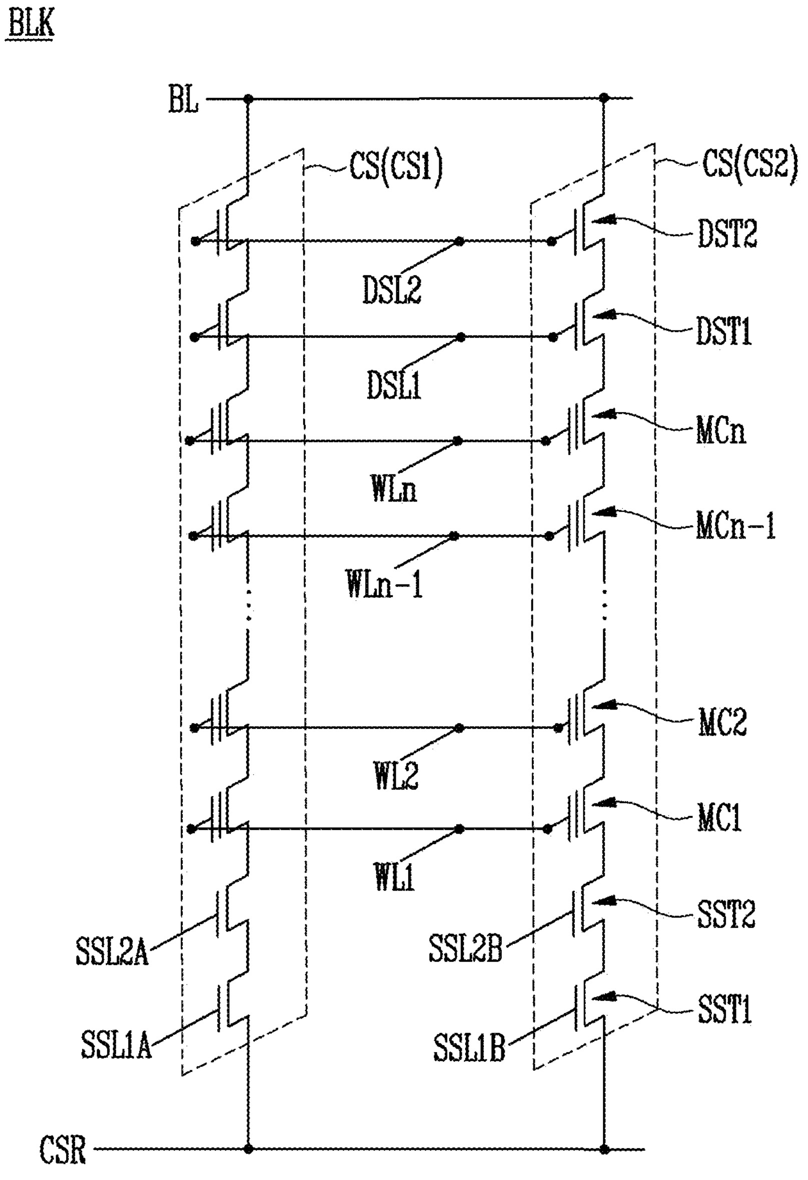
FIG. 4 is a circuit diagram of a memory cell array structure in accordance with an embodiment of the present disclosure.

FIG. 4 is a circuit diagram of a memory cell array structure in accordance with an embodiment of the present disclosure.

Referring to FIG. 4, the memory cell array structure may include a memory block BLK. Each memory block BLK may include a plurality of memory cell strings CS. The plurality of memory cell strings CS may each be connected to a common source layer CSR, a bit line BL, a plurality of word lines WL1 to WLn (n is a natural number of 2 or more), and a plurality of select lines SSL1A, SSL2A, SSL1B, SSL2B, DSL1, and DSL2.

A voltage for precharging a channel layer of a corresponding memory cell string CS may be applied to the bit line BL. A voltage for discharging a potential of the channel layer of the memory cell string CS may be applied to the common source layer CSR. Each memory cell strings CS may be connected to the common source line CSL, shown in FIG. 1, via the common source layer CSR.

The plurality of memory cell strings CS may be connected in parallel to the common source layer CSR. The plurality of memory cell strings CS may be divided into a plurality of columns and a plurality of rows. Memory cell strings of a column corresponding to the bit line BL may be connected in parallel to the bit line BL. Memory cell strings of a row corresponding to each of the plurality of word lines WL1 to WLn may be connected parallel to each of the plurality of word lines WL1 to WLn. FIG. 4 illustrates memory cell strings of an arbitrary column connected to the same bit line BL.

Each memory cell string CS may include a plurality of memory cells MC1 to MCn connected in series through a channel layer. Each memory cell string CS may further include at least one drain select transistor connected to the bit line BL and at least one source select transistor connected to the common source layer CSR. In an embodiment, each memory cell strings CS may include a first source select transistor SST1 connected to the common source layer CSR, a second source select transistor SST2 connected in series to the first source select transistor SST1, a first drain select transistor DST1 connected in series to the plurality of memory cells MC1 to MCn, and a second drain select transistor DST2 connected between the first drain select transistor DST1 and the bit line BL. Although the following descriptions are described based on an embodiment in which each memory cell string CS includes a first source select transistor SST1, a second source select transistor SST2, a plurality of memory cells MC1 to MCn, a first drain select transistor DST1, and a second drain select transistor DST2, which are connected in series, the embodiment of the present disclosure is not limited thereto.

The plurality of select lines SSL1A, SSL2A, SSL1B, SSL2B, DSL1, and DSL2 may be divided into a source select group SSL1A, SSL2A, SSL1B, and SSL2B and a drain select group DSL1 and DSL2. The plurality of word lines WL1 to WLn may be disposed between the source select group SSL1A, SSL2A, SSL1B, and SSL2B and the drain select group DSL1 and DSL2. The source select group SSL1A, SSL2A, SSL1B, and SSL2B may include a first source select line SSL1A or SSL1B connected to a gate of the first source select transistor SST1 and a second source select line SSL2A or SSL2B connected to a gate of the second source select transistor SST2. The drain select group DSL1 and DSL2 may include a first drain select line DSL1 connected to a gate of the first drain select transistor DST1 and a second drain select line DSL2 connected to a gate of the second drain select transistor DST2. The plurality of word lines WL1 to WLn may be connected to a plurality of gates of the plurality of memory cells MC1 to MCn, respectively.

Memory cell strings CS connected to the same bit line BL may be a part of the same column group. Each of the plurality of word lines WL1 to WLn may be designed to commonly control memory cell strings CS of the same column group. At least one of the source select group SSL1A, SSL2A, SSL1B and SSL2B and the drain select group DSL1 and DSL2 may be designed to individually control memory cell strings CS of the same column group.

In an embodiment, the memory block BLK may include a first memory cell string CS1 and a second memory cell string CS2, which are connected to the same bit line BL. To control the first memory cell string CS1 and the second memory cell string CS2, each of the plurality of word lines WL1 to WLn may be commonly connected to the first memory cell string CS1 and the second memory cell string CS2. To individually control the first memory cell string CS1 and the second memory cell string CS2, the source select group may be isolated into a first group and a second group, the first group including a first source select line SSL1A and a second source select line SSL2A, which are connected to the first memory cell string CS1, and the second group including a first source select line SSL1B and a second source select line SSL2B, which are connected to the second memory cell string CS2. To control the first memory cell string CS1 and the second memory cell string CS2, each of the first drain select line DSL1 and the second drain select line DSL2 may be commonly connected to the first memory cell string CS1 and the second memory cell string CS2.

Figure 5A:
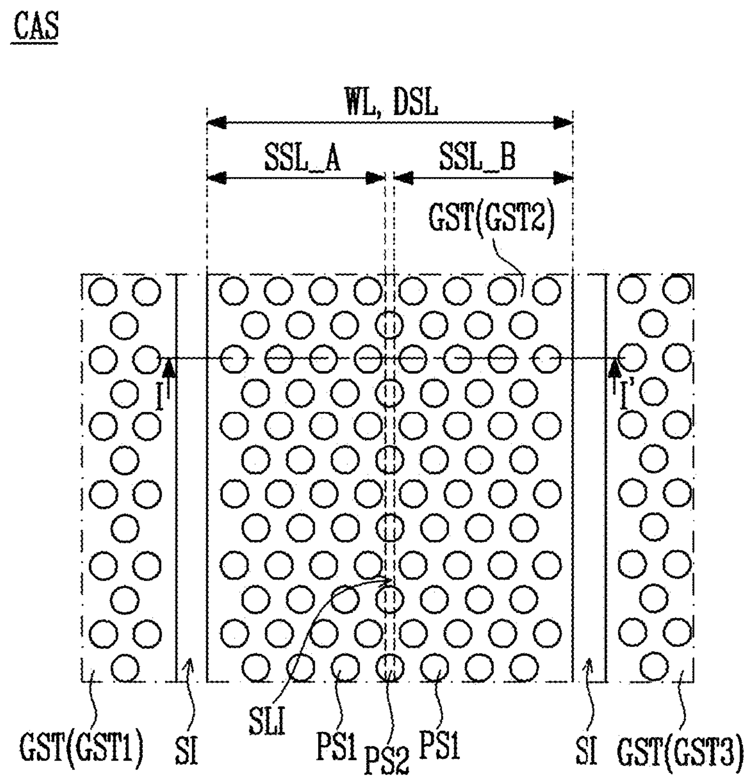
FIGS. 5A, 5B, and 5C are views illustrating a memory cell array structure in accordance with an embodiment of the present disclosure.
Figure 5B:
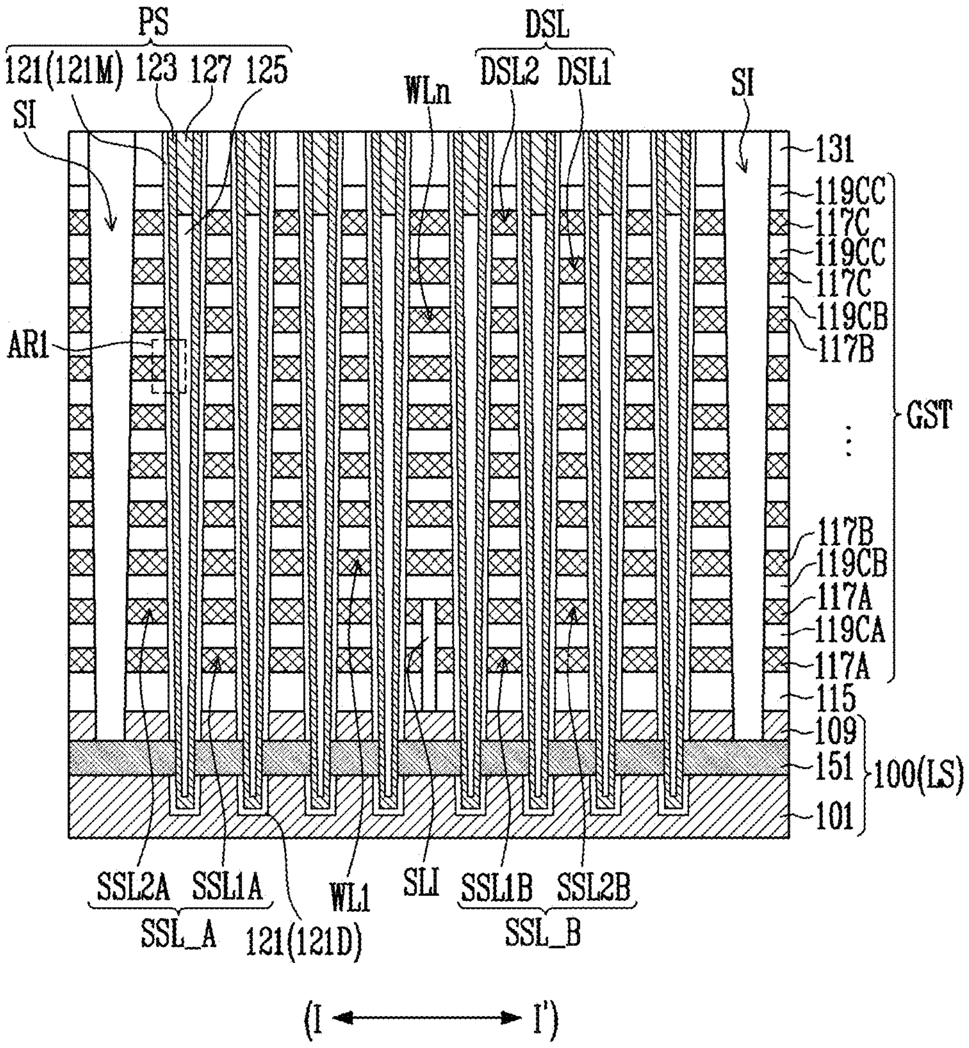
Figure 5C:
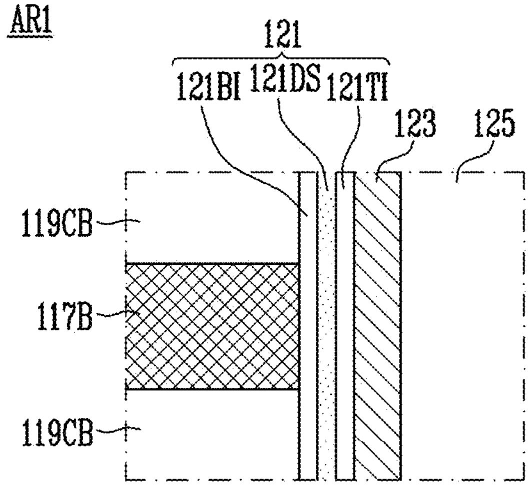

FIGS. 5A, 5B, and 5C are views illustrating a memory cell array structure in accordance with an embodiment of the present disclosure. FIG. 5A is a plan view illustrating a memory cell array structure, FIG. 5B is a sectional view of the memory cell array structure taken along line I-I' shown in FIG. 5A, and FIG. 5C is an enlarged sectional view of region “AR1” shown in FIG. 5B.

Referring to FIG. 5A, the memory cell array structure CAS may include a plurality of gate stack structures GST, the plurality of gate stack structures GST being partitioned by a slit SI. In an embodiment, the slit SI may be formed between consecutive gate stack structures. Specifically, the slit SI may be formed between a first gate stack structure GST1 and a second gate stack structure GST2 and between the second gate stack structure GST2 and a third gate stack structure GST3.

Each gate stack structure GST may include a word line group WL, a drain select group DSL, a first group SSL_A of source select lines, and a second group SSL_B of source select lines. The first group SSL_A of source select lines and the second group SSL_B of source select lines may be isolated from each other by a select line isolation insulating layer SLI.

Each gate stack structure GST may be penetrated by a plurality of pillar structures PS1 and PS2. The plurality of pillar structures PS1 and PS2 may be arranged in a zigzag form. The plurality of pillar structures PS1 and PS2 may include first pillar structures PS1 arranged on both sides of the select line isolation insulating layer SLI and second pillar structures PS2 overlapping with the select line isolation insulating layer SLI. The first pillar structure PS1 may be used as a cell pillar defining a memory cell string. The second pillar structure PS2 may be used as a cell pillar defining a memory cell string or may be used as a dummy pillar that is not involved in an operation of the memory cell string.

Referring to FIG. 5B, each gate stack structure GST may overlap with a lower structure LS. The lower structure LS may include a doped semiconductor structure 100.

Referring to FIGS. 3 and 5B, the doped semiconductor structure 100 may be disposed in a first region CER of a circuit area CIR of the lower structure LS. The doped semiconductor structure 100 may include at least one doped semiconductor layer. The doped semiconductor structure 100 may include at least one of an n-type impurity and a p-type impurity. The doped semiconductor structure 100 may include at least one of a first conductivity type doped region including the n-type impurity as a majority carrier and a second conductivity type doped region including the p-type impurity as a majority carrier. The first conductivity type doped region may be provided as the common source layer CSR, described with reference to FIG. 4, and the second conductivity type doped region may be provided as a well region.

In an embodiment, the doped semiconductor structure 100 may include a first semiconductor layer 101, a second semiconductor layer 109, and a channel contact semiconductor layer 151. The channel contact semiconductor layer 151 may be disposed between the first semiconductor layer 101 and the second semiconductor layer 109. The first semiconductor layer 101, the second semiconductor layer 109, and the channel contact semiconductor layer 151 may be used as the common source layer CSR, described with reference to FIG. 4. Each of the first semiconductor layer 101, the second semiconductor layer 109, and the channel contact semiconductor layer 151, which are provided as the common source layer CSR, may include the n-type impurity as a majority carrier.

The doped semiconductor structure 100 may be covered with a first interlayer insulating layer 115. A gate stack structure GST may be disposed over the doped semiconductor structure 100 with the first interlayer insulating layer 115 interposed therebetween. The gate stack structure GST may include a plurality of conductive layers 117A, 117B, and 117C and a plurality of second interlayer insulating layers 119CA, 119CB, and 119CC. The conductive layers 117A, 117B, and 117C and the second interlayer insulating layers 119CA, 119CB, and 119CC may be alternately stacked over the first interlayer insulating layer 115. Each of the conductive layers 117A, 117B, and 117C may include various conductive materials, such as a doped semiconductor layer and a metal layer. The doped semiconductor layer may include a doped silicon layer. The metal layer may include tungsten, copper, molybdenum, and the like. Each of the conductive layers 117A, 117B, and 117C may further include a conductive metal nitride layer. The conductive metal nitride layer may include titanium nitride, tantalum nitride, and the like. Each of the first interlayer insulating layer 115 and the second interlayer insulating layers 119CA, 119CB, and 119CC may include an oxide, such as a silicon oxide layer and a silicon oxynitride layer.

At least one lower conductive layer (e.g., 117A) closest to the lower structure LS, among the plurality of conductive layers 117A, 117B, and 117C, may be penetrated by the select line isolation insulating layer SLI. Accordingly, a lower conductive layer 117A may be isolated into select lines. In an embodiment, two lower conductive layers 117A adjacent to the doped semiconductor structure 100 may be isolated into a first group SSL_A and a second group SSL_B, the first group SSL_A including a first source select line SSL1A and a second source select line SSL2A and the second group SSL_B including a first source select line SSL1B and a second source select line SSL2B. The other conductive layers 117B and 117C, except the two lower conductive layers 117A, may be used as a word line group and a drain select group DSL, the word line group including a plurality of word lines WL1 to WLn and the drain select group DSL including a first drain select line DSL1 and a second drain select line DSL2.

The gate stack structure GST may be covered with a third interlayer insulating layer 131. The slit SI may penetrate the third interlayer insulating layer 131 and may be disposed between consecutive gate stack structures GST. The slit SI may extend to penetrate the first interlayer insulating layer 115 and the second semiconductor layer 109. A filler disposed in the slit SI may be diverse. In an embodiment, the filler may include an insulating layer. In another embodiment, the filler may further include at least one of a conductive layer and a semiconductor layer in addition to the insulating layer.

Each pillar structure PS may include a multi-layer 121 and a channel layer 123.

The channel layer 123 may penetrate the gate stack structure GST. The channel layer 123 may extend to penetrate the first interlayer insulating layer 115 and the third interlayer insulating layer 131. The channel layer 123 may extend into the doped semiconductor structure 100 and may be in contact with the doped semiconductor structure 100. A contact surface between the channel layer 123 and the doped semiconductor structure 100 may be variously defined at a sidewall portion of the channel layer 123, an end portion of the channel layer 123, and the like. In an embodiment, the channel layer 123 may include a sidewall surrounded by the channel contact semiconductor layer 151, and the sidewall of the channel layer 123 may be in contact with the channel contact semiconductor layer 151. To this end, the channel layer 123 may penetrate the second semiconductor layer 109 and may extend into the first semiconductor layer 101. The channel layer 123 may be formed of a semiconductor material, such as silicon (Si), germanium (Ge), or a mixture thereof, which can be used as a channel region of the memory cell string.

The multi-layer 121 may extend along an outer wall of the channel layer 123. The multi-layer 121 may be isolated into a memory layer 121M and a dummy memory layer 121D by the channel contact semiconductor layer 151. The memory layer 121M may be a portion of the multi-layer 121 interposed between the gate stack structure GST and the channel layer 123, and the dummy memory layer 121D may be a portion of the multi-layer 121 interposed between the first semiconductor layer 101 and the channel layer 123.

The memory layer 121M may extend along the sidewall of the channel layer 123 to be interposed between each of the plurality of conductive layers 117A, 117B, 117C and the channel layer 123. The memory layer 121M may extend between the second semiconductor layer 109 and the channel layer 123.

Referring to FIGS. 5B and 5C, the multi-layer 121 may include a tunnel insulating layer 121TI, a data storage layer 121DS, and a blocking insulating layer 121BI. The data storage layer 121DS may be formed of a material layer capable of storing data changed using Fowler-Nordheim tunneling. In an embodiment, the data storage layer 121DS may be formed of a charge trap insulating layer, be formed of a floating gate layer, or be formed of an insulating layer including a conductive nano dot. The charge trap insulating layer may include a silicon nitride layer. The tunnel insulating layer 121TI may be disposed between the data storage layer 121DS and the channel layer 123. The tunnel insulating layer 121TI may include an insulating material, such as a silicon oxide layer. The blocking insulating layer 121BI may extend along an outer wall of the data storage layer 121DS. The blocking insulating layer 121BI may include at least one of a silicon oxide layer and a high dielectric constant layer. The high dielectric constant layer may include an aluminum oxide layer, and the like, each of which has a higher dielectric constant than that of a silicon dioxide layer.

The pillar structure PS may further include a core insulating layer 125 and a capping pattern 127. The core insulating layer 125 and the capping pattern 127 may be disposed in a central region of the pillar structure PS. The capping pattern 127 may be disposed on the core insulating layer 125. The channel layer 123 may extend along an outer wall of the core insulating layer 125 and a sidewall of the capping pattern 127. The capping pattern 127 may be formed of a doped semiconductor layer including at least one of an n-type impurity and a p-type impurity. In an embodiment, the capping pattern 127 may include a doped silicon including the n-type impurity as a majority carrier.

Figure 6A:
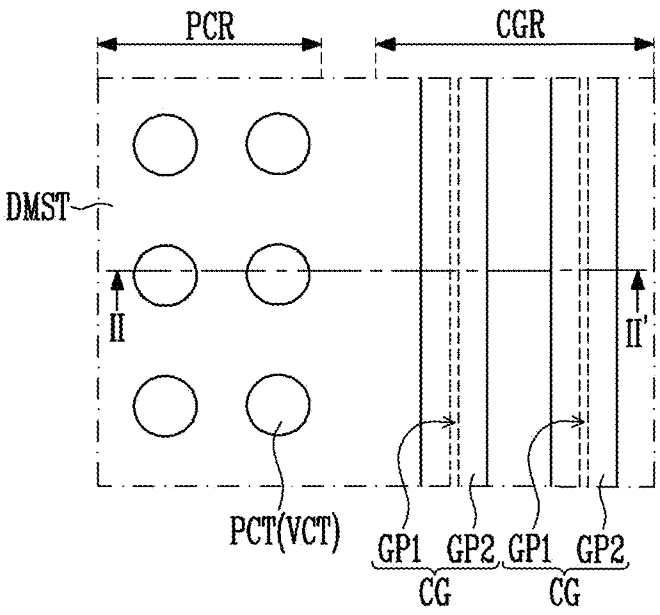
FIGS. 6A and 6B are views illustrating a peripheral contact structure and a chip guard structure in accordance with an embodiment of the present disclosure.
Figure 6B:
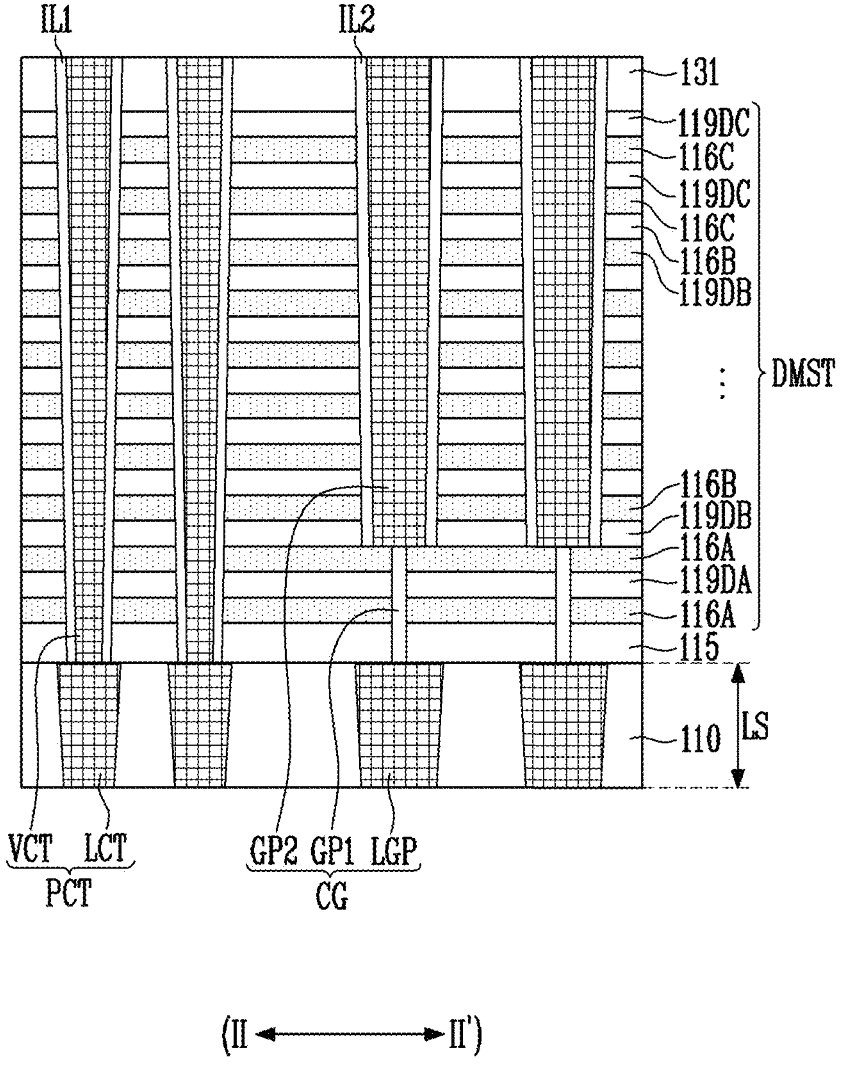

FIGS. 6A and 6B are views illustrating a peripheral contact structure and a chip guard structure in accordance with an embodiment of the present disclosure. FIG. 6A is a plan view illustrating a peripheral contact structure and a chip guard structure, and FIG. 6B is a sectional view of the peripheral contact structure and the chip guard structure, which are taken along line II-II' as shown in FIG. 6A.

Referring to FIG. 6A, the peripheral contact structure PCT may be disposed in the second region PCR of circuit region CIR of the first structure ST1 as shown in FIG. 3. The chip guard structure CG may be disposed in the chip guard region CGR of the first structure ST1.

The chip guard structure CG may include an insulative chip guard pattern GP1 and a conductive chip guard pattern GP2. The insulative chip guard pattern GP1 and the conductive chip guard pattern GP2 may be disposed inside a dummy stack structure DMST. The dummy stack structure DMST may extend to surround the peripheral contact structure PCT.

Referring to FIGS. 3 and 6B, a lower structure LS may further include an insulating structure 110. The insulating structure 110 may be disposed in the second region PCR in the circuit region CIR and may extend to the chip guard region CGR. The lower structure LS may include a lower conductive contact structure LCT and a lower conductive chip guard pattern LGP, each penetrating the insulating structure 110. The lower conductive contact structure LCT may be a portion of the peripheral contact structure PCT. The lower conductive contact structure LCT may be disposed in the second region PCR of the circuit region CIR. The lower conductive chip guard pattern LGP may be a portion of the chip guard structure CG. The lower conductive chip guard pattern LGP may be disposed in the chip guard region CGR.

Referring to FIGS. 5B and 6B, the insulating structure 110 may be disposed at substantially the same level as the doped semiconductor structure 100. The first interlayer insulating layer 115 may extend to cover the insulating structure 110.

Referring to FIGS. 6A and 6B, the dummy stack structure DMST may overlap with the chip guard region CGR of the lower structure LS and may extend to overlap with the second region PCR of the lower structure LS. The dummy stack structure DMST may be disposed over the lower structure LS with the first interlayer insulating layer 115 interposed therebetween. The dummy stack structure DMST may include a plurality of dummy layers 116A, 116B, and 116C and a plurality of dummy interlayer insulating layers 119DA, 119DB, and 119DC, which are alternately stacked over the first interlayer insulating layer 115.

Referring to FIGS. 5B and 6B, the dummy stack structure DMST may be disposed at substantially the same level as the gate stack structure GST. The plurality of dummy interlayer insulating layers 119DA, 119DB, and 119DC may be disposed at substantially the same levels as the plurality of second interlayer insulating layers 119CA, 119CB, and 119CC and may be formed of substantially the same insulating material as the plurality of second interlayer insulating layers 119CA, 119CB, and 119CC. In an embodiment, the plurality of dummy interlayer insulating layers 119DA, 119DB, and 119DC may include an oxide, such as a silicon oxide layer or a silicon oxynitride layer. The plurality of dummy layers 116A, 116B, and 116C may be disposed at substantially the same levels as the plurality of conductive layers 117A, 117B, and 117C. The plurality of dummy layers 116A, 116B, and 116C may be formed of an insulating material having an etch selectivity with respect to the plurality of dummy interlayer insulating layers 119DA, 119DB, and 119DC. In an embodiment, the plurality of dummy layers 116A, 116B, and 116C may include a nitride, such as a silicon nitride layer. The third interlayer insulating layer 131 may extend to cover the dummy stack structure DMST.

Referring to FIGS. 6A and 6B, the lower conductive chip guard pattern LGP, the insulative chip guard pattern GP1, and the conductive chip guard pattern GP2 of the chip guard structure CG may be aligned in a line in a vertical direction. The vertical direction may be defined as a stacking direction of the plurality of dummy layers 116A, 116B, and 116C and the plurality of dummy interlayer insulating layers 119DA, 119DB, and 119DC. The insulative chip guard pattern GP1 may penetrate a lower portion of the dummy stack structure DMST and the first interlayer insulating layer 115, and the conductive chip guard pattern GP2 may penetrate an upper portion of the dummy stack structure DMST and the third interlayer insulating layer 131.

Referring to FIGS. 5B and 6B, the lower portion of the dummy stack structure DMST may include lower dummy layers 116A of the plurality of dummy layers 116A, 116B, and 116C and a lower dummy interlayer insulating layer 119DA of the plurality of dummy interlayer insulating layers 119DA, 119DB, and 119DC. The lower dummy layers 116A and the lower dummy interlayer insulating layer 119DA may be associated with lower conductive layers 117A and a lower second interlayer insulating layer 119CA, which are penetrated by the select line isolation insulating layer SLI. The lower dummy layers 116A may be disposed at substantially the same levels as the lower conductive layers 117A, and the lower dummy interlayer insulating layer 119DA may be disposed at substantially the same level as the lower second interlayer insulating layer 119CA.

The insulative chip guard pattern GP1 may be associated with the select line isolation insulating layer SLI. The insulative chip guard pattern GP1 may be formed using a process that forms the select line isolation insulating layer SLI. The insulative chip guard pattern GP1 may have a sidewall overlapping with the select line isolation insulating layer SLI and may be disposed at substantially the same level as the select line isolation insulating layer SLI. Also, the insulative chip guard pattern GP1 may include substantially the same material as the select line isolation insulating layer SLI. The insulative chip guard pattern GP1 may include a first end portion in contact with the lower conductive chip guard pattern LGP and a second end portion in contact with the conductive chip guard pattern GP2.

Referring to FIGS. 5B and 6B, the upper portion of the dummy stack structure DMST may include the other dummy layers 116B and 116C, excluding the lower dummy layers 116A, and the other dummy interlayer insulating layers 119DB and 119DC, excluding the lower dummy interlayer insulating layer 119DA. The conductive chip guard pattern GP2 may be aligned over the insulative chip guard pattern GP1 and may penetrate the upper portion of the dummy stack structure DMST by penetrating the dummy layer 116B and 116C and the dummy interlayer insulating layers 119DB and 119DC.

Referring to FIG. 6B, the peripheral contact structure PCT may further include a conductive vertical contact structure VCT. The conductive vertical contact structure VCT may be aligned over the lower conductive contact structure LCT. The conductive vertical contact structure VCT may extend away from the lower conductive contact structure LCT in a vertical direction to penetrate the third interlayer insulating layer 131. The conductive vertical contact structure VCT may have a sidewall overlapping with the insulative chip guard pattern GP1 and the conductive chip guard pattern GP2. The dummy stack structure DMST may extend to surround the conductive vertical contact structure VCT.

An insulating layer IL1 may be interposed between the conductive vertical contact structure VCT and the dummy stack structure DMST, and an insulating layer IL2 may be interposed between the conductive chip guard pattern GP2 and the dummy stack structure DMST.

Referring to FIGS. 6A and 6B, each of the insulative chip guard pattern GP1 and the conductive chip guard pattern GP2 of the chip guard structure GP may be formed in a line shape on a plane. In forming the line-shaped chip guard structure GP, after a process that forms the lower portion of the dummy stack structure DMST and a process that forms the insulative chip guard pattern GP1 penetrating the lower portion of the dummy stack structure DMST are performed, a process that forms the upper portion of the dummy stack structure DMST and a process that forms the conductive chip guard pattern GP2 penetrating the upper portion of the dummy stack structure DMST may be performed. Accordingly, although the height of the dummy stack structure DMST increases, a process failure in which the chip guard structure CG is not disposed at the lower portion of the dummy stack structure DMST can be reduced.

FIGS. 7A, 8A, 9A, 10, 11A, 12, 13A, 14, 15, and 16 are sectional views illustrating a process of forming a memory cell array structure in accordance with an embodiment of the present disclosure.

FIGS. 7B, 8B, 9B, 11B, 13B, 17, 18, and 19 are sectional views illustrating a process of forming a peripheral contact structure and a chip guard structure in accordance with an embodiment of the present disclosure.

Although not shown in the drawings, processes described below may be performed over a sacrificial substrate such as a silicon wafer or may be performed over a semiconductor substrate including the second structure ST2 described with reference to FIG. 2.

Figure 7A:
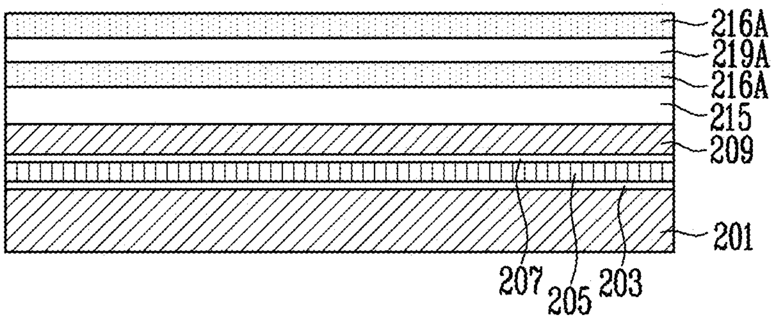
FIGS. 7A, 8A, 9A, 10, 11A, 12, 13A, 14, 15, and 16 are sectional views illustrating a process of forming a memory cell array structure in accordance with an embodiment of the present disclosure.
Figure 7B:
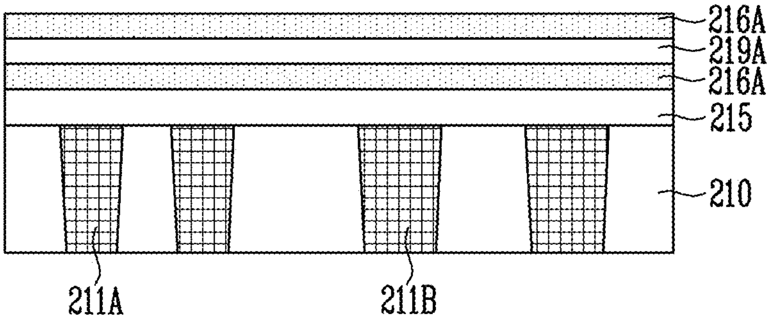
FIGS. 7B, 8B, 9B, 11B, 13B, 17, 18, and 19 are sectional views illustrating a process of forming a peripheral contact structure and a chip guard structure in accordance with an embodiment of the present disclosure.

Referring to FIGS. 7A and 7B, a first semiconductor layer 201, a first protective layer 203, a source sacrificial layer 205, a second protective layer 207, and a second semiconductor layer 209 may be sequentially stacked over a sacrificial substrate (not shown) or a semiconductor substrate (not shown) including the second structure. The first protective layer 203 and the second protective layer 207 may include a material having an etch selectivity with respect to the first semiconductor layer 201, the second semiconductor layer 209, and the source sacrificial layer 205. The source sacrificial layer 205 may include a material having an etch selectivity with respect to the first semiconductor layer 201 and the second semiconductor layer 209. In an embodiment, the first semiconductor layer 201 and the second semiconductor layer 209 may include a doped silicon layer including at least one of an n-type impurity and a p-type impurity. The first protective layer 203 and the second protective layer 207 may include an oxide layer, and the source sacrificial layer 205 may include an undoped silicon layer or a nitride layer.

Subsequently, a portion of each of the first semiconductor layer 201, the first protective layer 203, the source sacrificial layer 205, the second protective layer 207, and the second semiconductor layer 209 may be etched. Accordingly, the first semiconductor layer 201, the first protective layer 203, the source sacrificial layer 205, the second protective layer 207, and the second semiconductor layer 209 may remain as a preliminary doped semiconductor structure in a first region of a circuit region as shown in FIG. 7A. Also, the first semiconductor layer 201, the first protective layer 203, the source sacrificial layer 205, the second protective layer 207, and the second semiconductor layer 209 may be removed in a second region of the circuit region and a chip guard region.

Subsequently, an insulating structure 210 may be formed in a region in which the first semiconductor layer 201, the first protective layer 203, the source sacrificial layer 205, the second protective layer 207, and the second semiconductor layer 209 are removed. Then, a lower conductive contact structure 211A and a lower conductive chip guard pattern 211B may be formed, which penetrate the insulating structure 210.

The first semiconductor layer 201, the first protective layer 203, the source sacrificial layer 205, the second protective layer 207, and the second semiconductor layer 209 of the preliminary doped semiconductor structure, the insulating structure 210, the lower conductive contact structure 211A, and the lower conductive chip guard pattern 211B may form a preliminary lower structure. A first interlayer insulating layer 215 may be formed over the preliminary lower structure.

After that, a first material layer 216A and a second material layer 219A may be alternately stacked over the first interlayer insulating layer 215. The first material layer 216A may include a material having an etch selectivity with respect to the second material layer 219, and the second material layer 219A may include an insulating material. In an embodiment, the first material layer 216A may include a nitride, such as a silicon nitride layer, and the second material layer 219A may include an oxide, such as a silicon oxide layer.

Figure 8A:
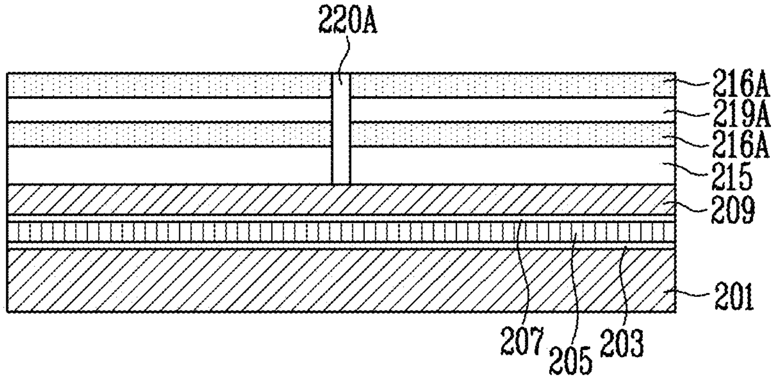
Figure 8B:
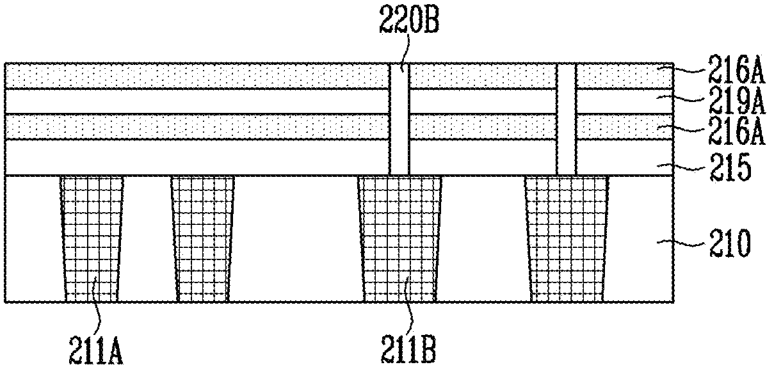

Referring to FIGS. 8A and 8B, an insulative chip guard pattern 220B may be formed using a process that forms a select line isolation insulating layer 220A. The select line isolation insulating layer 220A may penetrate the first material layer 216A and the second material layer 219A, which overlap with the first semiconductor layer 201, the first protective layer 203, the source sacrificial layer 205, the second protective layer 207, and the second semiconductor layer 209 of the preliminary doped semiconductor structure, and may extend to penetrate the first interlayer insulating layer 215. The insulative chip guard pattern 220B may penetrate the first material layer 216A and the second material layer 219A, which overlap with the lower conductive chip guard pattern 211B, and may extend to penetrate the first interlayer insulating layer 215.

Figure 9A:
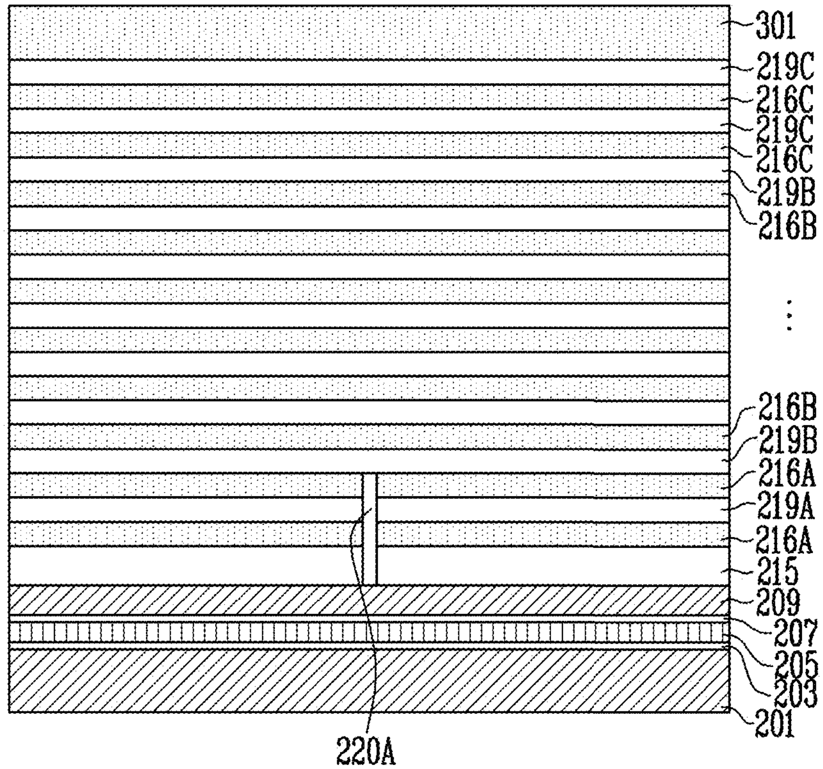
Figure 9B:
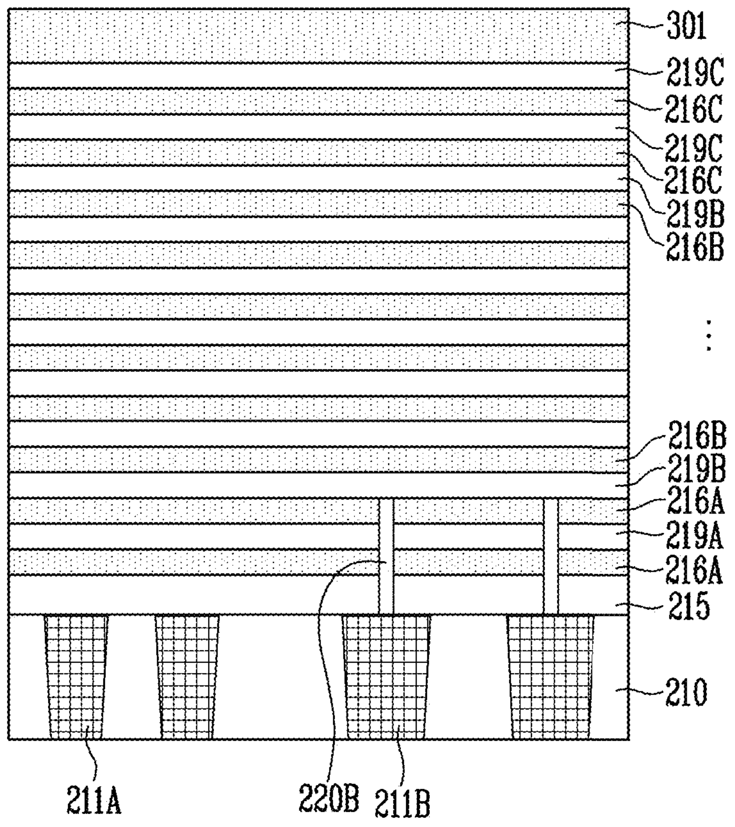

Referring to FIGS. 9A and 9B, after the select line isolation insulating layer 220A and the insulative chip guard pattern 220B are formed, a plurality of third material layers 219B and a plurality of fourth material layers 216B may be alternately stacked over a stack structure of the first material layer 216A and the second material layer 219A. Subsequently, a fifth material layer 216C and a sixth material layer 219C may be alternately stacked over a stack structure of the plurality of third material layers 219B and the plurality of fourth material layers 216B. The plurality of fourth material layers 216B and the fifth material layer 216C may include the same material as the first material layer 216A, and the plurality of third material layers 219B and the sixth material layer 219C may include the same material as the second material layer 219A. A portion of each of the second material layer 219A, the plurality of third material layers 219B, and the sixth material layer 219C may correspond to the second interlayer insulating layer, described with reference to FIG. 5B, and another portion of each of the second material layer 219A, the plurality of third material layers 219B, and the sixth material layer 219C may correspond to the dummy interlayer insulating layer, described with reference to FIG. 6B.

Subsequently, a mask layer 301 may be formed over a stack structure of the fifth material layer 216C and the sixth material layer 219C.

Figure 10:
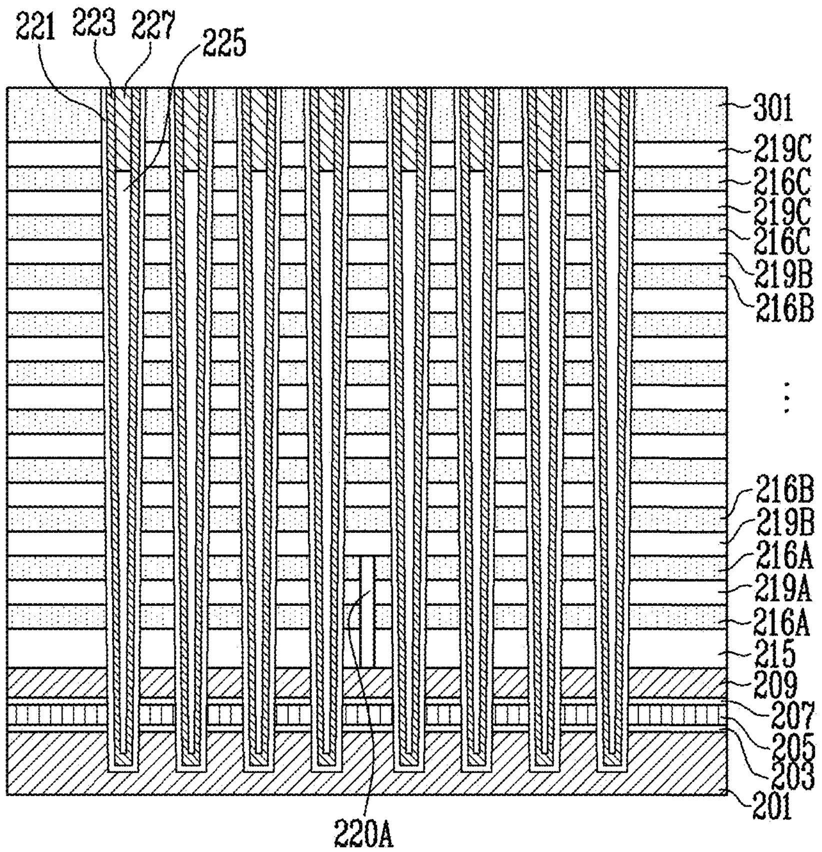

Referring to FIG. 10, after a plurality of openings are formed in the mask layer 301, the first material layer 216A, the second material layer 219A, the plurality of third material layers 219B, the plurality of fourth material layers 216B, the fifth material layer 216C, and the sixth material layer 219C may be etched through the plurality of openings. In addition, the first interlayer insulating layer 215, the second semiconductor layer 209, the second protective layer 207, the source sacrificial layer 205, the first protective layer 203, and the first semiconductor layer 201 may be sequentially etched through the plurality of openings. Accordingly, a plurality of channel holes may be formed. Each channel hole may penetrate the mask layer 301, the first material layer 216A, the second material layer 219A, the plurality of third material layers 219B, the plurality of fourth material layers 216B, the fifth material layer 216C, the sixth material layer 219C, the first interlayer insulating layer 215, the second semiconductor layer 209, the second protective layer 207, the source sacrificial layer 205, and the first protective layer 203 and may extend into the first semiconductor layer 201.

Subsequently, a multi-layer 221 may be formed on a surface of the channel hole. The multi-layer 221 may include a blocking insulating layer, a data storage layer, and a tunnel insulating layer as described with reference to FIG. 5C. Then, a channel layer 223 may be formed on an inner wall of the multi-layer 221. The channel layer 223 may be formed of a semiconductor material, such as silicon (Si), germanium (Ge), or a mixture thereof. A central region of the channel hole, which is opened by the channel layer 223, may be filled with a core insulating layer 225 and a capping pattern 227. The capping pattern 227 may include a doped semiconductor layer.

Figure 11A:
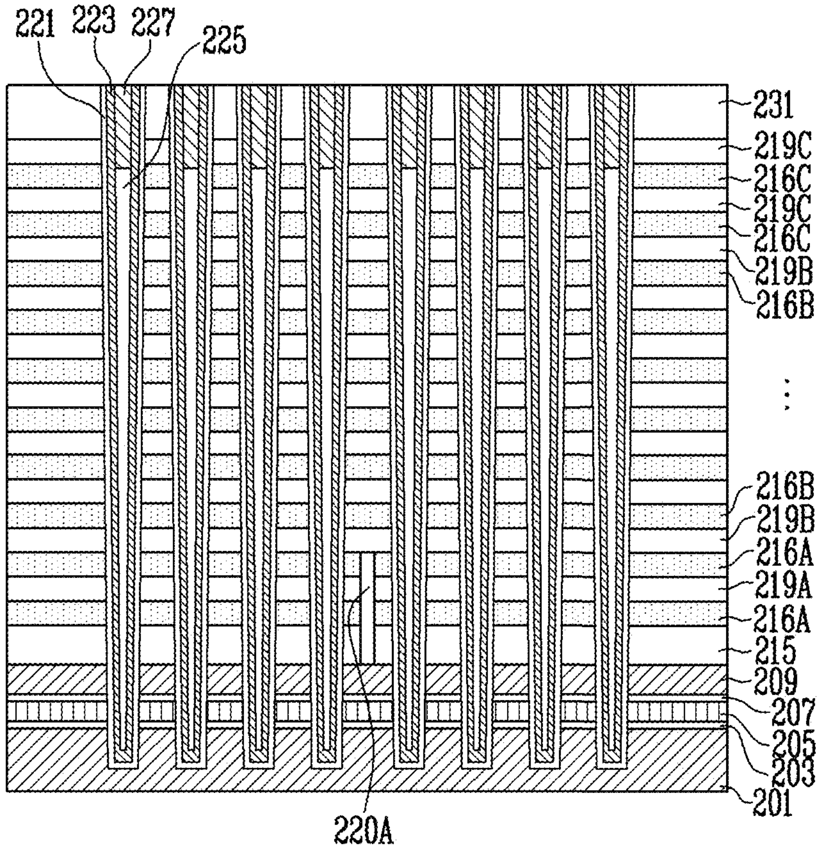
Figure 11B:
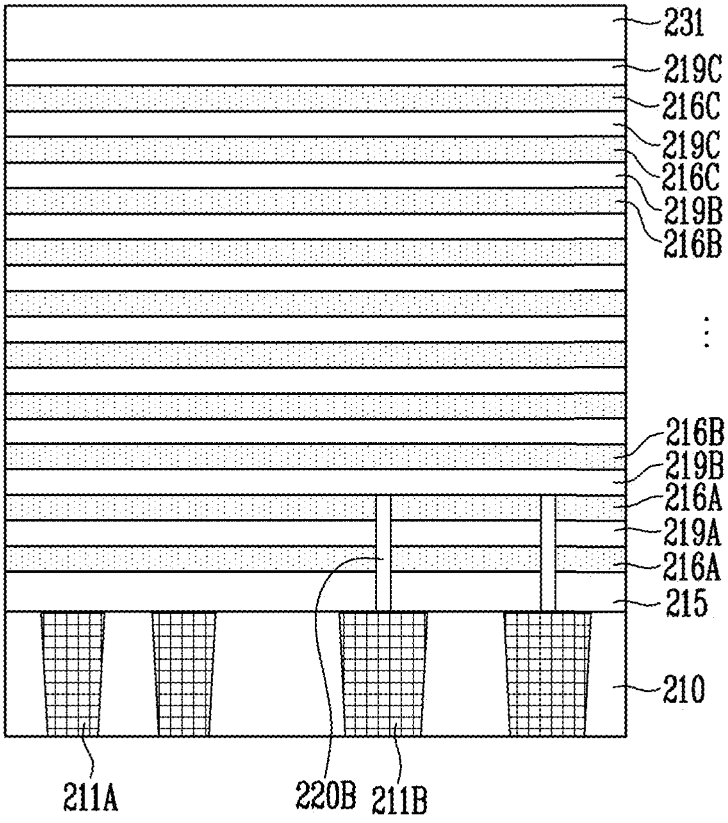

Referring to FIGS. 11A and 11B, the mask layer 301, shown in FIG. 10, may be removed. Subsequently, an insulating layer 231 may be formed in a region in which the mask layer 301 is removed. The insulating layer 231 may correspond to the third interlayer insulating layer described with reference to FIGS. 5B and 6B.

Figure 12:
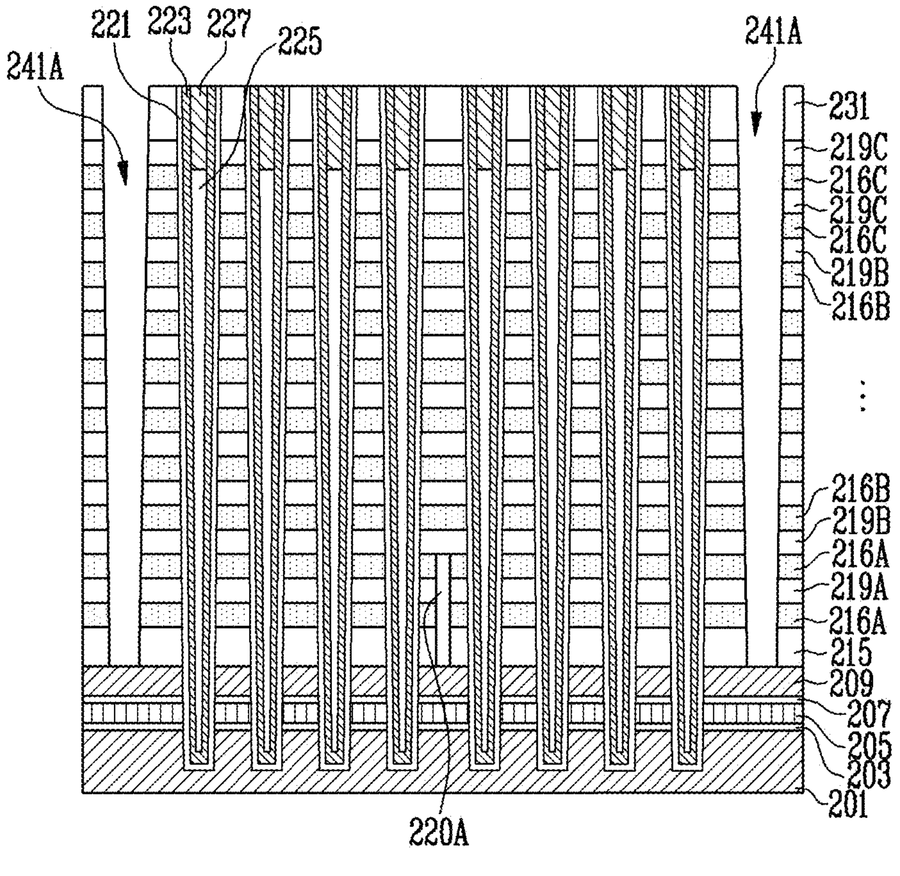

Referring to FIG. 12, the first interlayer insulating layer 215, the first material layer 216A, the second material layer 219A, the plurality of third material layers 219B, the plurality of fourth material layers 216B, the fifth material layer 216C, the sixth material layer 219C, and the insulating layer 231, which overlap with the first semiconductor layer 201, the first protective layer 203, the source sacrificial layer 205, the second protective layer 207, and the second semiconductor layer 209 of the preliminary doped semiconductor structure may be etched. Accordingly, a slit 241A may be formed. During an etching process that forms the slit 241A, the second semiconductor layer 209 may be used as an etch stop layer. The second semiconductor layer 209 may be exposed through the slit 241A.

Figure 13A:
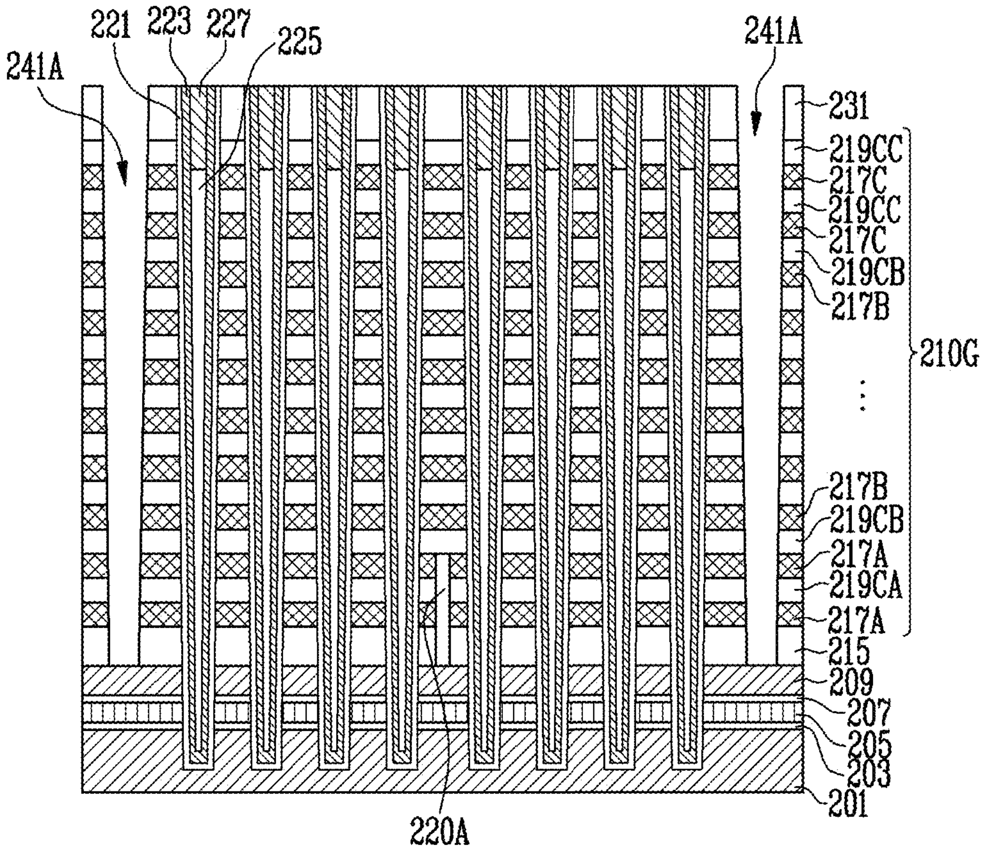
Figure 13B:
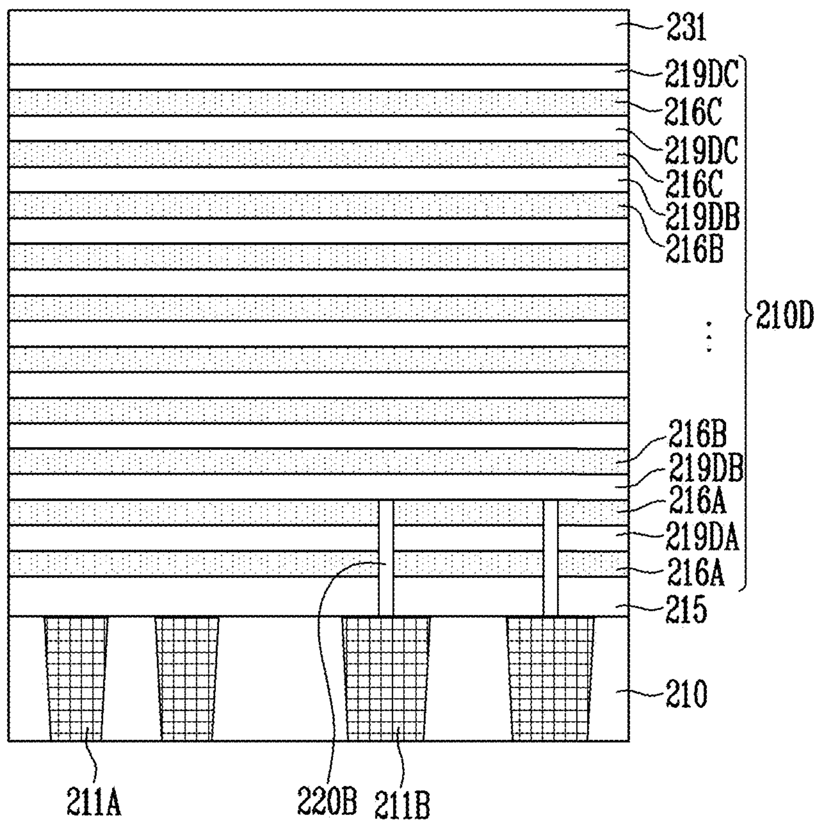

Referring to FIGS. 13A and 13B, the first material layer 216A, the plurality of fourth material layers 216B, and the fifth material layer 216C, which are shown in FIG. 12, may be replaced with a plurality of conductive layers 217A, 217B, and 217C through the slit 241A. A portion of each of the first material layer 216A, the plurality of fourth material layers 216B, and the fifth material layer 216C, which are adjacent to the slit 241A, may be replaced with a corresponding conductive layer. A partial region of each of the first material layer 216A, the plurality of fourth material layers 216B, and the fifth material layer 216C, which overlap with a region in which the insulating structure 210, the lower conductive contact structure 211A, and the lower conductive chip guard pattern 211B are disposed, is not replaced with the conductive layer but may remain as a dummy layer, thereby constituting a dummy stack structure 210D.

The second material layer, the plurality of third material layers, and a sixth material layer may be divided into a plurality of second interlayer insulating layers 219CA, 219CB, and 219CC and a plurality of dummy interlayer insulating layers 219DA, 219DB, and 219DC. To form a gate stack structure 210G, the plurality of second interlayer insulating layers 219CA, 219CB, and 219CC and the plurality of conductive layers 217A, 217B, and 217C may be alternately disposed between the first interlayer insulating layer 215 and the insulating layer 231. To form the dummy stack structure 210D, the plurality of dummy interlayer insulating layers 219DA, 219DB, and 219DC may be alternately disposed with a plurality of dummy layers as remaining portions of the first material layer 216A, the plurality of fourth material layers 216B, and the fifth material layer 216C between the first interlayer insulating layer 215 and the insulating layer 231.

Figure 14:
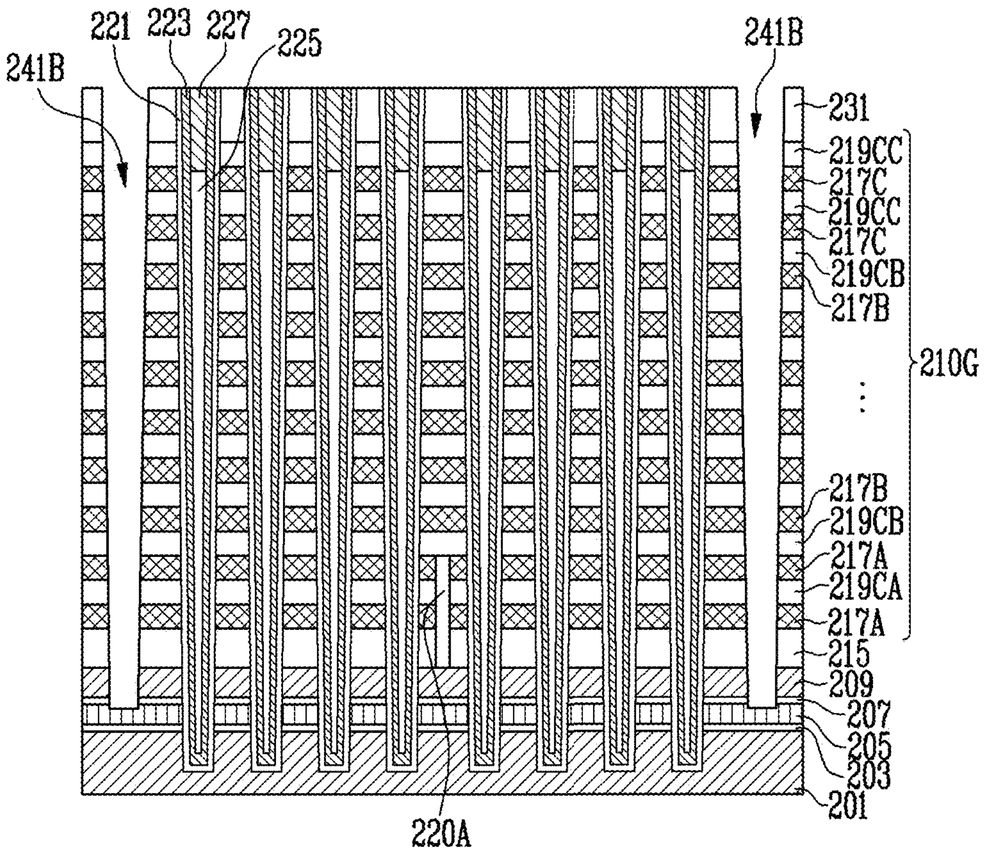

Referring to FIG. 14, after the gate stack structure 210G is formed, the second semiconductor layer 209 and the second protective layer 207 may be etched through the slit 241A shown in FIG. 13A. Accordingly, an extended slit 241B may be formed. The source sacrificial layer 205 may be exposed through the extended slit 241B. Although not shown in the drawing, a spacer layer may be formed on a sidewall of the gate stack structure 210G before the second semiconductor layer 209 is etched. The extended slit 241B may be formed in a state in which the gate stack structure 210G is protected by the spacer layer.

Figure 15:
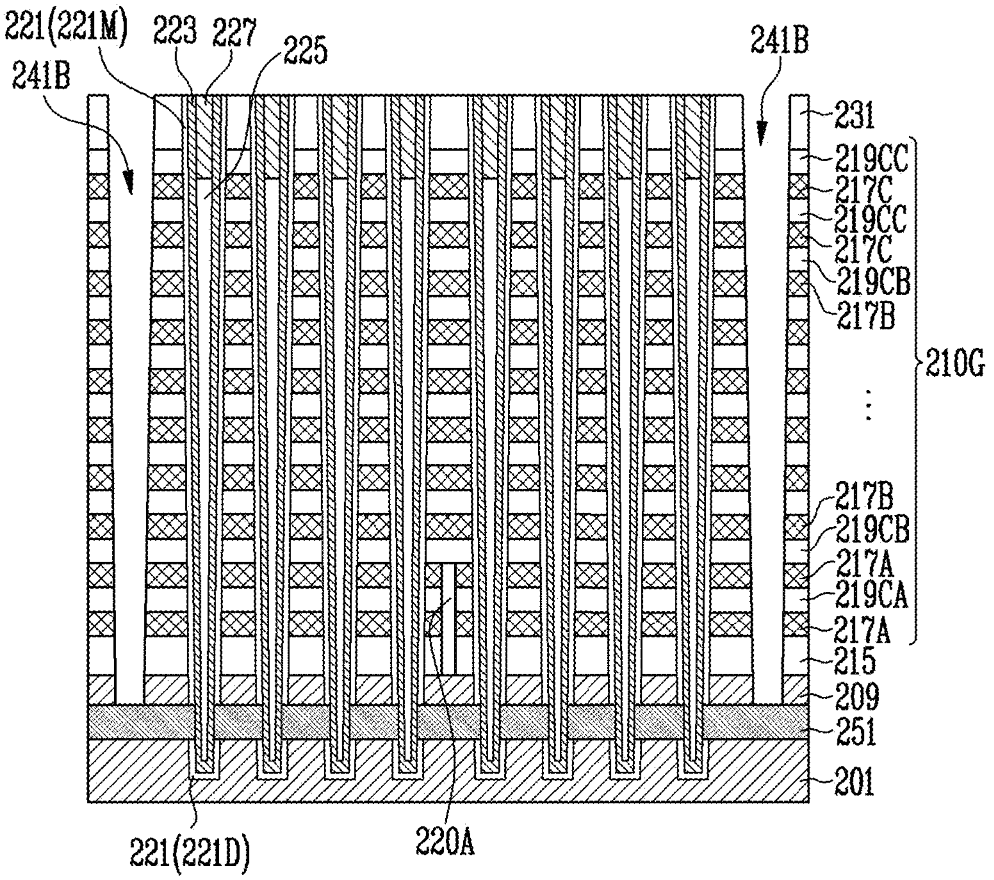

Referring to FIG. 15, the source sacrificial layer 205, shown in FIG. 14, may be selectively removed through the extended slit 241B. A portion of the multi-layer 221 may be exposed through a region in which the source sacrificial layer 205 is removed. Subsequently, a channel layer 223 may be exposed by etching an exposed region of the multi-layer 221. The multi-layer 221 may be isolated into a memory layer 221M and a dummy memory layer 221D. While the exposed region of the multi-layer 221 is etched, the first protective layer 203 and the second protective layer 207, which are shown in FIG. 14, may be removed. The spacer layer, described with reference to FIG. 14, may remain or may be removed while the exposed region of the multi-layer 221 is etched.

Subsequently, a channel contact semiconductor layer 251 may be formed between the first semiconductor layer 201 and the second semiconductor layer 209. The channel contact semiconductor layer 251 may be in contact with each of the first semiconductor layer 201, the second semiconductor layer 209, and the channel layer 223. The channel contact semiconductor layer 251 may include at least one of an n-type impurity and a p-type impurity. In an embodiment, the channel contact semiconductor layer 251 may include an n-type doped silicon layer including the n-type impurity as a majority carrier.

Figure 16:
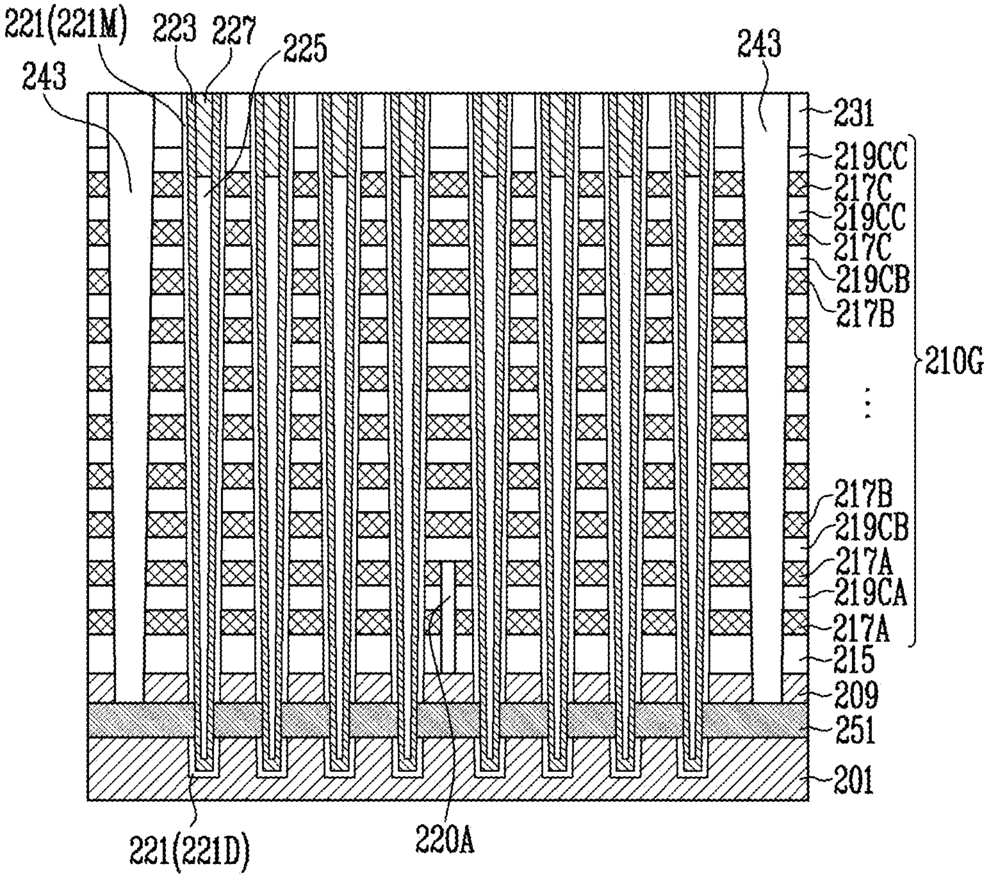

Referring to FIG. 16, the extended slit 241B, shown in FIG. 15, may be filled with various fillers 243.

Figure 17:
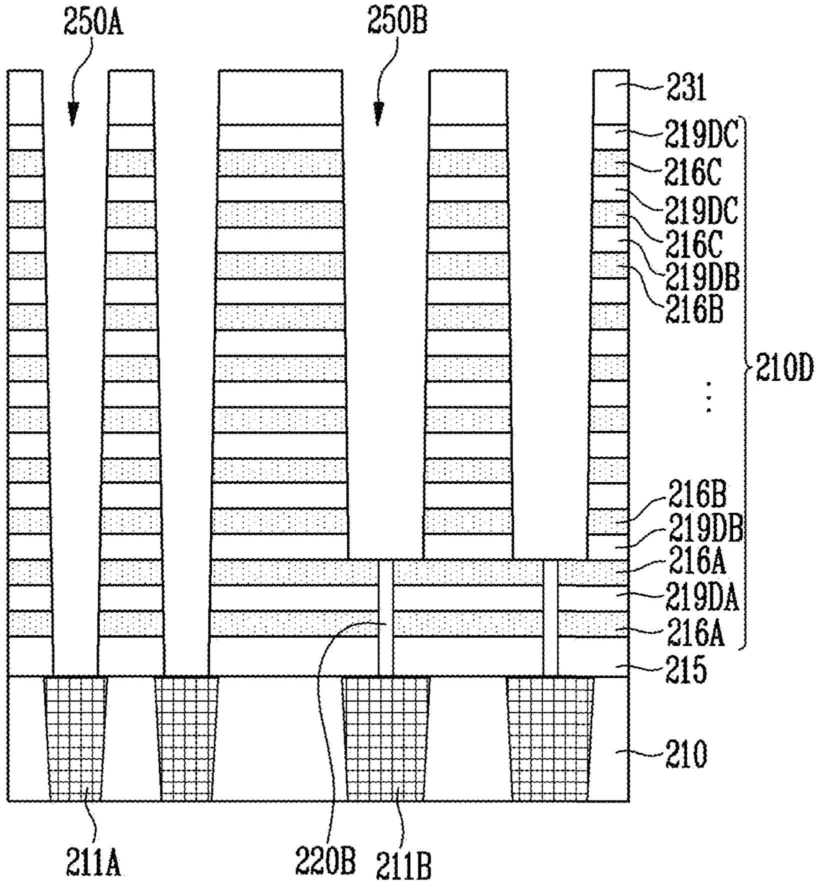

Referring to FIG. 17, a first opening 250A and a second opening 250B may be formed, which penetrate the insulating layer 231 and at least a portion of the dummy stack structure 210D.

The first opening 250A may penetrate the insulating layer 231, the dummy stack structure 210D, and the first interlayer insulating layer 215 to expose the lower conductive contact structure 211A. The second opening 250B may penetrate portions of the insulating layer 231 and the dummy stack structure 210D to expose the insulative chip guard pattern 220B. The second opening 250B may extend in a line shape on a plane in a similar manner to the conductive chip guard pattern GP2, which is shown in FIG. 5C. When the second opening 250B is formed in the line shape, a depth of the second opening 250B may be formed to be shallower than a depth of the first opening 250A. Although the depth of the second opening 250B is formed to be shallower than the depth of the first opening 250A, the second opening 250B may be formed to have a depth that still exposes the pre-formed insulative chip guard pattern 220B.

Figure 18:
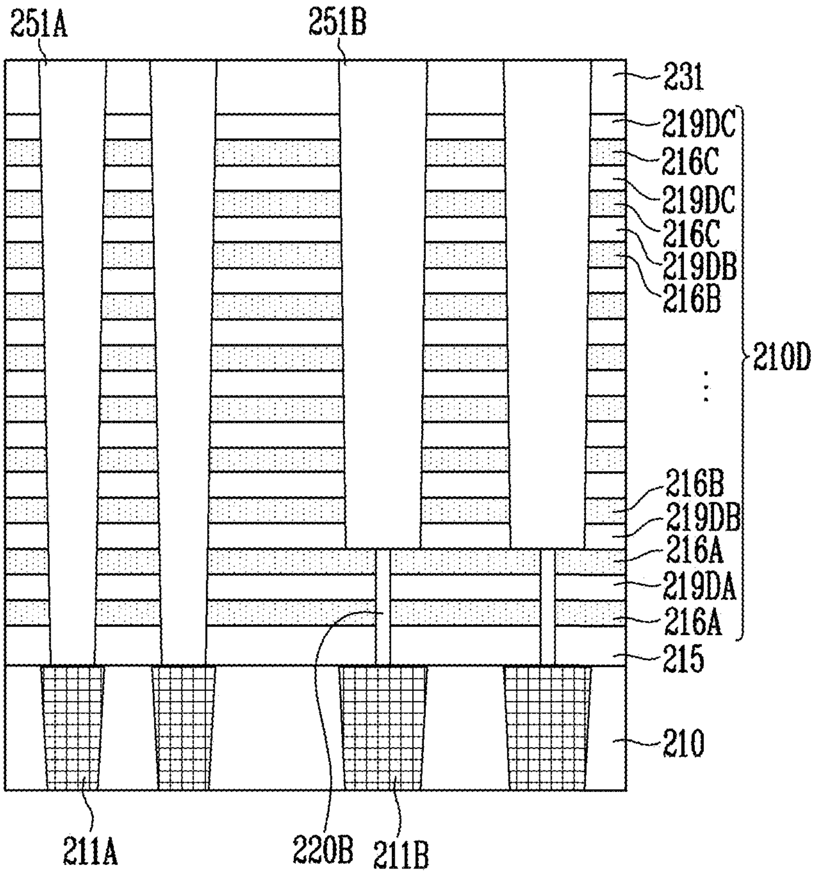

Referring to FIG. 18, insulating layers 251A and 251B may be respectively formed in the first opening 250A and the second opening 250B, which are shown in FIG. 17.

Figure 19:
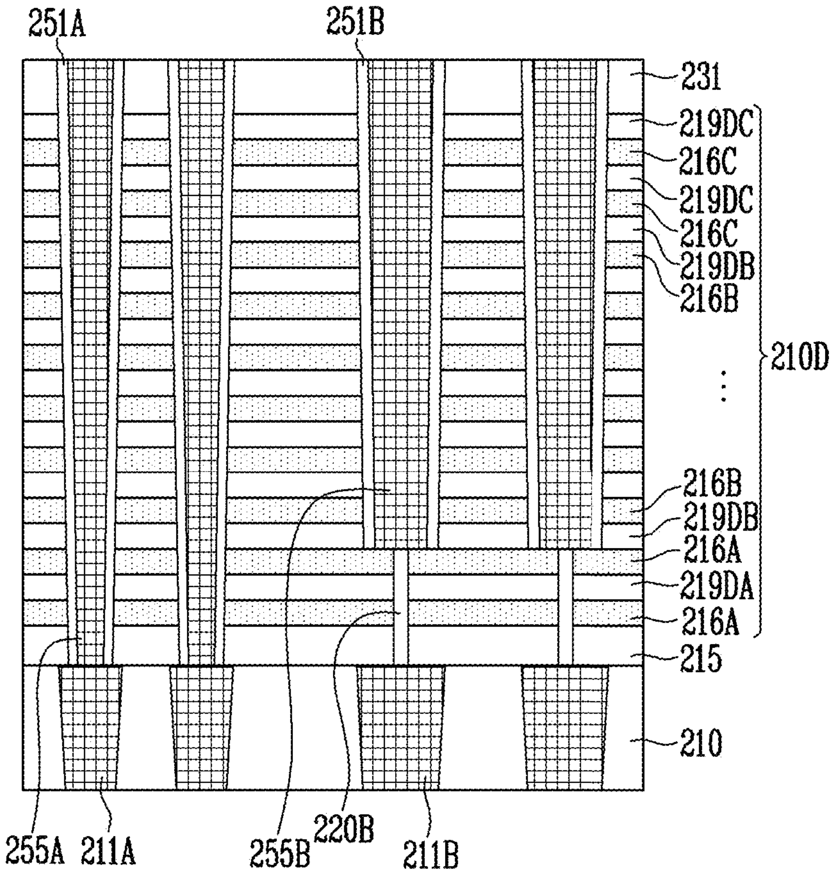

Referring to FIG. 19, a conductive vertical contact structure 255A and a conductive chip guard pattern 255B may be formed. The conductive vertical contact structure 255A may penetrate the insulating layer 251A in the first opening 250A, shown in FIG. 17, and may be connected to the lower conductive contact structure 211A. The conductive chip guard pattern 255B may penetrate the insulating layer 251B in the second opening 250B, shown in FIG. 17, and may be connected to the insulative chip guard pattern 220B.

Figure 20:
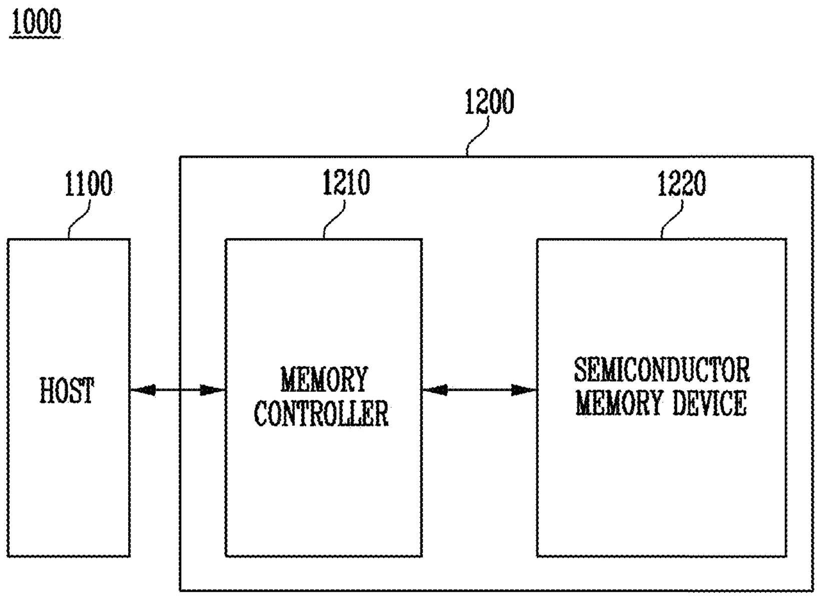
FIG. 20 is a block diagram illustrating an electronic system in accordance with embodiments of the present disclosure.

FIG. 20 is a block diagram illustrating an electronic system in accordance with embodiments of the present disclosure.

Referring to FIG. 20, the electronic system 1000 may be a computing system, a medical device, a communication device, a wearable device, a memory system, or the like. The electronic system 1000 may include a host 1100 and a storage device 1200.

Based on an interface, the host 1100 may store data in the storage device 1200 or read data stored in the storage device 1200. The interface may include at least one of a Double Data Rate (DDR) interface, a Universal Serial Bus (USB) interface, a Multi-Media Card (MMC) interface, an embedded MMC (eMMC) interface, a Peripheral Component Interconnection (PCI) interface, a PCI-Express (PCI-E) interface, an Advanced Technology Attachment (ATA) interface, a Serial ATA (SATA) interface, a Parallel ATA (PATA) interface, a Small Computer System Interface (SCSI), an Enhanced Small Disk Interface (ESDI), an Integrated Drive Electronics (IDE) interface, a firewire interface, a Universal Flash Storage (UFS) interface, and a Non-Volatile Memory express (NVMe) interface.

The storage device 1200 may include a memory controller 1210 and a semiconductor memory device 1220. In an embodiment, the storage device 1200 may be a storage medium, such as a Solid State Drive (SSD) or a Universal Serial Bus (USB) memory.

The memory controller 1210 may store data in the semiconductor memory device 1220 or read data stored in the semiconductor memory device 1220 under the control of the host 1100.

The semiconductor memory device 1220 may include one memory chip or a plurality of memory chips. The semiconductor memory device 1220 may store data or output stored data under the control of the memory controller 1210.

The semiconductor memory device 1220 may be a nonvolatile memory device. As described with reference to FIGS. 6A and 6B, the semiconductor memory device 1220 may include a dummy stack structure, an insulative chip guard pattern penetrating a lower portion of the dummy stack structure, and a conductive chip guard pattern that is aligned over the insulative chip guard pattern and penetrates an upper portion of the dummy stack structure.

According to an embodiment of the present disclosure, a process failure in a chip guard region can be reduced through a structure in which an insulative chip guard pattern and a conductive chip guard pattern overlap with each other. Thus, the stability of a manufacturing process of the semiconductor memory device can be improved.

What is claimed is:

1. A semiconductor memory device comprising:

a lower structure including a circuit region and a chip guard region, the chip guard region surrounding the circuit region;

a memory cell array structure overlapping with a first region of the circuit region of the lower structure;

a conductive vertical contact structure overlapping with a second region of the circuit region of the lower structure;

a dummy stack structure stacked over the chip guard region of the lower structure;

an insulative chip guard pattern penetrating a lower portion of the dummy stack structure; and a conductive chip guard pattern aligned over the insulative chip guard pattern, the conductive chip guard pattern penetrating an upper portion of the dummy stack structure;

wherein the insulative chip guard pattern includes a first end portion in contact with the lower structure and a second end portion in contact with the conductive chip guard pattern.

2. The semiconductor memory device of claim 1, wherein the memory cell array structure includes:

a plurality of conductive layers and a plurality of interlayer insulating layers that are alternately stacked over the lower structure;

a select line isolation insulating layer penetrating a lower conductive layer closest to the lower structure among the plurality of conductive layers such that the lower conductive layer is isolated into select lines;

a channel layer penetrating the plurality of conductive layers and the plurality of interlayer insulating layers on both sides of the select line isolation insulating layer; and a memory layer interposed between each of the plurality of conductive layers and the channel layer.

3. The semiconductor memory device of claim 2, wherein the insulative chip guard pattern has a sidewall overlapping with the select line isolation insulating layer.

4. The semiconductor memory device of claim 2, wherein the insulative chip guard pattern includes the same material as the select line isolation insulating layer.

5. The semiconductor memory device of claim 2, wherein the insulative chip guard pattern is disposed at substantially the same level as the select line isolation insulating layer.

6. The semiconductor memory device of claim 1, wherein the dummy stack structure includes a plurality of nitride layers and a plurality of oxide layers, which are alternately stacked over the lower structure.

7. The semiconductor memory device of claim 1, wherein the dummy stack structure extends to surround the conductive vertical contact structure.

8. The semiconductor memory device of claim 1, wherein the lower structure includes:

a doped semiconductor structure disposed in the first region of the circuit region;

an insulating structure disposed in the second region of the circuit region, the insulating structure extending to the chip guard region; and a lower conductive contact structure and a lower conductive chip guard pattern penetrating the insulating structure.

9. The semiconductor memory device of claim 8, wherein the conductive vertical contact structure:

extends away from the lower conductive contact structure; and has a sidewall overlapping with the insulative chip guard pattern and the conductive chip guard pattern.

10. The semiconductor memory device of claim 8, wherein the first end portion of the insulative chip guard pattern is in contact with the lower conductive chip guard pattern.

11. A semiconductor memory device comprising:

a lower structure including a circuit region and a chip guard region, the chip guard region surrounding the circuit region;

a memory cell array structure overlapping with a first region of the circuit region of the lower structure;

a conductive vertical contact structure overlapping with a second region of the circuit region of the lower structure;

a dummy stack structure stacked over the chip guard region of the lower structure;

an insulative chip guard pattern penetrating a portion of the dummy stack structure; and a conductive chip guard pattern penetrating a different portion of the dummy stack structure to contact the insulative chip guard pattern;

wherein the insulative chip guard pattern includes a first end portion in contact with the lower structure and a second end portion in contact with the conductive chip guard pattern.

* * * * *